US007652303B2

(12) United States Patent
Galli

(10) Patent No.: US 7,652,303 B2
(45) Date of Patent: Jan. 26, 2010

(54) LED LIGHTING ASSEMBLY

(76) Inventor: Robert D. Galli, 135 Circuit Dr., North Kingston, RI (US) 02852

(*) Notice: Subject to any disclaimer, the term of this patent is extended or adjusted under 35 U.S.C. 154(b) by 12 days.

(21) Appl. No.: 11/276,754

(22) Filed: Mar. 13, 2006

(65) Prior Publication Data

US 2006/0145180 A1 Jul. 6, 2006

Related U.S. Application Data

(63) Continuation-in-part of application No. 10/854,551, filed on May 26, 2004, now Pat. No. 7,083,305, which is a continuation-in-part of application No. 10/833,556, filed on Apr. 28, 2004, now Pat. No. 6,966,677, which is a continuation-in-part of application No. 10/796,360, filed on Mar. 9, 2004, now Pat. No. 7,055,989, which is a continuation-in-part of application No. 10/659,575, filed on Sep. 10, 2003, now Pat. No. 6,942,365, which is a continuation-in-part of application No. 10/315,336, filed on Dec. 10, 2002, now Pat. No. 6,827,468.

(60) Provisional application No. 60/338,893, filed on Dec. 10, 2001.

(51) Int. Cl.
*H01L 33/00* (2006.01)

(52) U.S. Cl. ......................... 257/99; 257/433; 257/676; 257/E33.058; 257/E33.072; 257/E33.75

(58) Field of Classification Search .................. 257/99, 257/433, 676; 438/27, 123
See application file for complete search history.

(56) References Cited

U.S. PATENT DOCUMENTS 2,928,934 A 3/1960 Atkin (Continued)

FOREIGN PATENT DOCUMENTS

GB 2241318 8/1991

(Continued)

OTHER PUBLICATIONS

LUMILEDS Lighting, LLC, Luxeon Emitter—Technical Datasheet DS25, 12 pages Nov. 2002.

(Continued)

*Primary Examiner*—A. Sefer
(74) *Attorney, Agent, or Firm*—Barlow, Josephs & Holmes, Ltd.

(57) ABSTRACT

The present invention provides a lighting head assembly that incorporates a high intensity LED package into an integral assembly including a heat sink and circuit board for further incorporation into other useful lighting devices. The present invention primarily includes a heat sink member that also serves as a mounting die and a reflector cup into which the LED package is mounted. The circuit board is placed behind the reflector cup and includes riser members that extend through holes in the rear wall of the reflector cup to facilitate electrical connections to the leads of the LED. This particular means for assembly allows the reflector cup and circuit board to cooperate to retain the LED package, provide electrical and control connections, provide integral heat sink capacity and includes an integrated reflector cup. In this manner, high intensity LED packages can be incorporated into lighting assemblies through the use of the present invention by simply installing the present invention into a housing and providing power connections thereto.

10 Claims, 23 Drawing Sheets

U.S. PATENT DOCUMENTS

| | | | | |
|---|---|---|---|---|
| 3,739,241 | A | 6/1973 | Thillays | 317/235 R |
| 5,183,328 | A | 2/1993 | Osteen | 362/294 |
| 5,223,747 | A | 6/1993 | Tschulena | 257/713 |
| 5,634,711 | A | 6/1997 | Kennedy et al. | 362/119 |
| 5,785,418 | A | 7/1998 | Hochstein | 362/373 |
| 6,293,684 | B1 | 9/2001 | Riblett | 362/184 |
| 6,305,825 | B1 * | 10/2001 | Okubo | 362/294 |
| 6,366,028 | B1 | 4/2002 | Wener et al. | |
| 6,407,411 | B1 | 6/2002 | Wojnarowski et al. | 257/99 |
| 6,428,189 | B1 * | 8/2002 | Hochstein | 362/373 |
| 6,452,217 | B1 | 9/2002 | Wojnarowski et al. | 257/99 |
| 6,481,874 | B2 | 11/2002 | Petroski | 362/373 |
| 6,498,355 | B1 | 12/2002 | Harrah et al. | 257/99 |
| 6,517,218 | B2 | 2/2003 | Hochstein | 362/294 |
| 6,541,800 | B2 * | 4/2003 | Barnett et al. | 257/98 |
| 6,827,468 | B2 | 12/2004 | Galli | 362/294 |
| 6,942,365 | B2 | 9/2005 | Galli | 362/294 |
| 6,966,677 | B2 | 11/2005 | Galli | 362/373 |
| 2003/0095408 | A1 | 5/2003 | Opolka | 362/241 |
| 2003/0107885 | A1 | 6/2003 | Galli | |
| 2004/0114393 | A1 * | 6/2004 | Galli | 362/555 |
| 2004/0130892 | A1 | 7/2004 | Galli | 362/187 |
| 2004/0160765 | A1 * | 8/2004 | Emil et al. | 362/208 |
| 2004/0190285 | A1 | 9/2004 | Galli | 362/157 |
| 2005/0017366 | A1 | 1/2005 | Galli | 257/758 |
| 2005/0024864 | A1 | 2/2005 | Galli | 362/202 |

FOREIGN PATENT DOCUMENTS

| | | | |
|---|---|---|---|
| JP | 2002299700 | A | 10/2002 |
| WO | 0214738 | A1 | 2/2002 |

OTHER PUBLICATIONS

LUMILEDS Lighting, LLC, Thermal Design Using Luxeon Power Light Sources—Application Brief AB05, 11 pages Nov. 2002.

* cited by examiner

LED LIGHTING ASSEMBLY

CROSS-REFERENCE TO RELATED APPLICATIONS

This application is related to and claims priority from earlier filed provisional patent application No. 60/338,893, filed Dec. 10, 2001 and is a continuation-in-part of U.S. patent application Ser. No. 10/854,551, filed May 26, 2004, now U.S. Pat. No. 7,083,305 which is a continuation-in-part of U.S. patent application Ser. No. 10/833,556, filed Apr. 28, 2004, now U.S. Pat. No. 6,966,677, issued Nov. 22, 2005, which is a is a continuation-in-part of U.S. patent application Ser. No. 10/796,360, filed Mar. 9, 2004, now U.S. Pat. No. 7,055,989 which is a continuation-in-part of U.S. patent application Ser. No. 10/659,575, filed Sep. 10, 2003, now U.S. Pat. No. 6,942,365, issued Sep. 13, 2005, which is a continuation-in-part of U.S. patent application Ser. No. 10/315,336, filed Dec. 10, 2002, now U.S. Pat. No. 6,827,468, issued Dec. 7, 2004.

BACKGROUND OF THE INVENTION

The present invention relates to a new assembly for packaging a high intensity LED lamp for further incorporation into a lighting assembly. More specifically, this invention relates to an assembly for housing a high intensity LED lamp that provides integral electrical connectivity, integral heat dissipation and an integral reflector device in a compact and integrated package for further incorporation into a lighting device and more specifically for use in a flashlight.

Currently, several manufacturers are producing high brightness light emitting diode (LED) packages in a variety of forms. These high brightness packages differ from conventional LED lamps in that they use emitter chips of much greater size, which accordingly have much higher power consumption requirements. In general, these packages were originally produced for use as direct substitutes for standard LED lamps. However, due to their unique shape, size and power consumption requirements they present manufacturing difficulties that were originally unanticipated by the LED manufacturers. One example of a high brightness LED of this type is the Luxeon™ Emitter Assembly LED (Luxeon is a trademark of Lumileds Lighting, LLC). The Luxeon LED uses an emitter chip that is four times greater in size than the emitter chip used in standard LED lamps. While this LED has the desirable characteristic of producing a much greater light output than the standard LED, it also generates a great deal more heat than the standard LED. If this heat is not effectively dissipated, it may cause damage to the emitter chip and the circuitry required to drive the LED.

Often, to overcome the buildup of heat within the LED, a manufacturer will incorporate a heat dissipation pathway within the LED package itself. The Luxeon LED, for example, incorporates a metallic contact pad into the back of the LED package to transfer the heat out through the back of the LED. In practice, it is desirable that this contact pad in the LED package be placed into contact with further heat dissipation surfaces to effectively cool the LED package. In the prior art attempts to incorporate these packages into further assemblies, the manufacturers that used the Luxeon LED have attempted to incorporate them onto circuit boards that include heat transfer plates adjacent to the LED mounting location to maintain the cooling transfer pathway from the LED. While these assemblies are effective in properly cooling the LED package, they are generally bulky and difficult to incorporate into miniature flashlight devices. Further, since the circuit boards that have these heat transfer plates include a great deal of heat sink material, making effective solder connections to the boards is difficult without applying a large amount of heat. The Luxeon LED has also been directly mounted into plastic flashlights with no additional heat sinking. Ultimately however, these assemblies malfunction due to overheating of the emitter chip, since the heat generated cannot be dissipated.

There is therefore a need for an assembly that provides for the mounting of a high intensity LED package that includes a great deal of heat transfer potential in addition to providing a means for further incorporating the LED into the circuitry of an overall lighting assembly.

BRIEF SUMMARY OF THE INVENTION

In this regard, the present invention provides an assembly that incorporates a high intensity LED package, such as the Luxeon Emitter Assembly described above, into an integral housing for further incorporation into other useful lighting devices. The present invention can be incorporated into a variety of lighting assemblies including but not limited to flashlights, specialty architectural grade lighting fixtures and vehicle lighting. The present invention primarily includes two housing components, namely an inner mounting die, and an outer enclosure. The inner mounting die is formed from a highly thermally conductive material. While the preferred material is brass, other materials such as thermally conductive polymers or other metals may be used to achieve the same result. The inner mounting die is cylindrically shaped and has a recess in the top end. The recess is formed to frictionally receive the mounting base of a high intensity LED assembly. A longitudinal groove is cut into the side of the inner mounting die that may receive an insulator strip or a strip of printed circuitry, including various control circuitry thereon. Therefore, the inner mounting die provides both electrical connectivity to one contact of the LED package and also serves as a heat sink for the LED. The contact pad at the back of the LED package is in direct thermal communication with the inner surface of the recess at the top of the inner mounting die thus providing a highly conductive thermal path for dissipating the heat away from the LED package.

The outer enclosure of the present invention is preferably formed from the same material as the inner mounting die. In the preferred embodiment, this is brass but may be thermally conductive polymer or other metallic materials. The outer enclosure slides over the inner mounting die and has a circular opening in the top end that receives the clear optical portion of the Luxeon LED package therethrough. The outer enclosure serves to further transfer heat from the inner mounting die and the LED package, as it is also highly thermally conductive and in thermal communication with both the inner mounting die and the LED package. The outer enclosure also covers the groove in the side of the inner mounting die protecting the insulator strip and circuitry mounted thereon from damage.

Another feature of the outer enclosure of the present invention is that the end that receives the optical portion of the LED package also serves as a reflector for collecting the light output from the LED package and further focusing and directing it into a collimated beam of light. After assembly, it can be seen that the present invention provides a self contained packaging system for the Luxeon Emitter Assembly or any other similar packaged high intensity LED device. Assembled in this manner, the present invention can be incorporated into any type of lighting device.

In particular, the assembled package is then placed into a flashlight housing. The flashlight housing of the present invention is further modified in accordance with the present disclosure to further enhance the heat management of the overall flashlight assembly in that the housing has vent openings in the side wall thereof. The vent openings are provided in the side wall at locations adjacent the outer enclosure of the package. In this manner, improved air circulation and heat dissipation is provided by facilitating the circulation of free air around the heat dissipating surfaces of the outer enclosure.

Accordingly, one of the objects of the present invention is the provision of an assembly for packaging a high intensity LED. Another object of the present invention is the provision of an assembly for packaging a high intensity LED that includes integral heat sink capacity. A further object of the present invention is the provision of an assembly for packaging a high intensity LED that includes integral heat sink capacity while further providing means for integral electrical connectivity and control circuitry. Yet a further object of the present invention is the provision of an assembly for packaging a high intensity LED that includes integral heat sink capacity, a means for electrically connectivity and an integral reflector cup that can creates a completed flashlight head for further incorporation into a flashlight housing or other lighting assembly.

Other objects, features and advantages of the invention shall become apparent as the description thereof proceeds when considered in connection with the accompanying illustrative drawings.

BRIEF DESCRIPTION OF THE DRAWINGS

In the drawings which illustrate the best mode presently contemplated for carrying out the present invention.

DETAILED DESCRIPTION OF THE INVENTION

Figure 1:
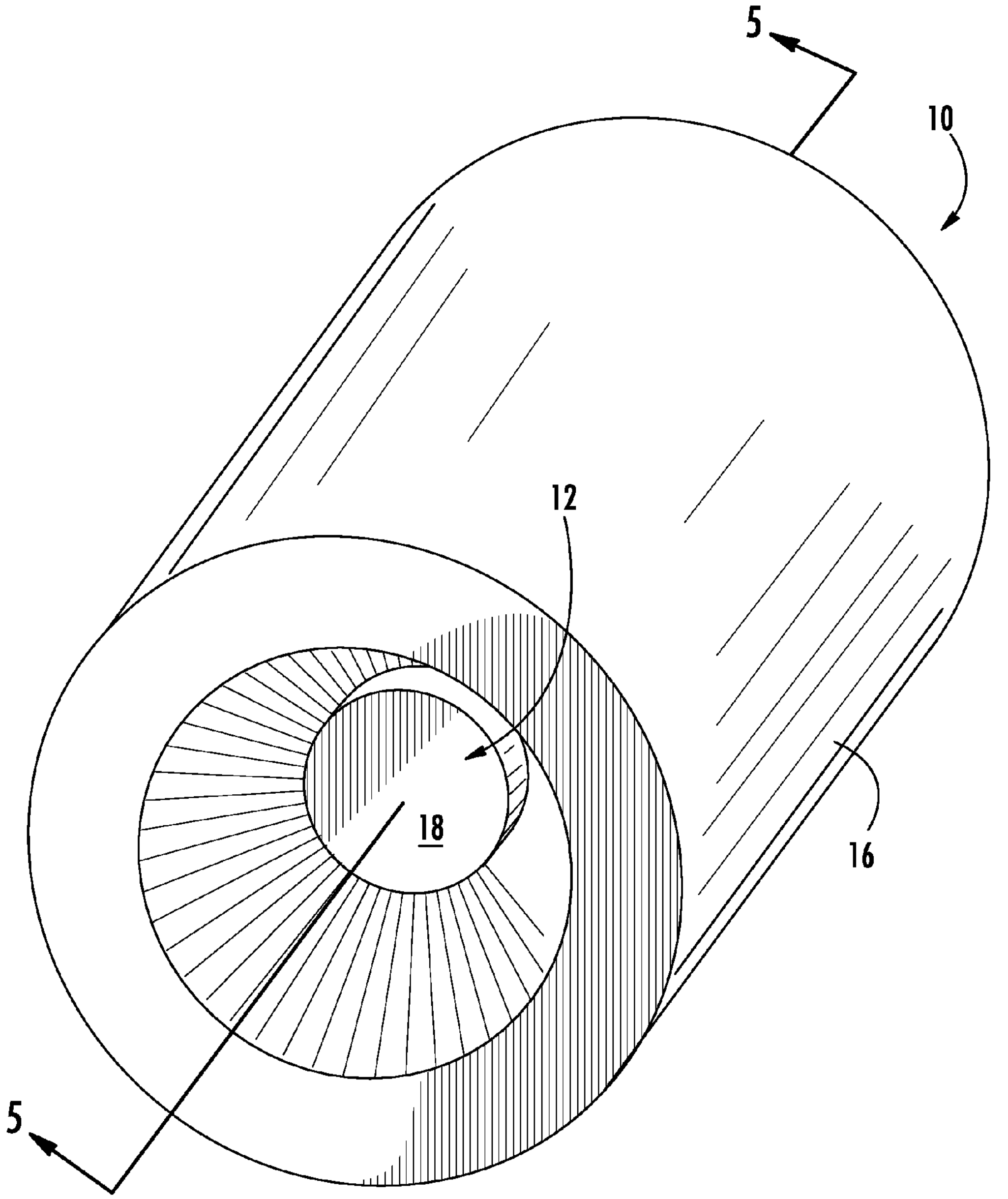
FIG. 1 is a perspective view of the LED lighting assembly of the present invention.

Referring now to the drawings, the light emitting diode (LED) lighting assembly of the present invention is illustrated and generally indicated at 10 in FIGS. 1-5. Further, a schematic diagram is shown in FIG. 6 generally illustrating the present invention incorporated into a flashlight circuit. As will hereinafter be more fully described, the present invention illustrates an LED lighting assembly 10 for further incorporation into a lighting device. For the purposes of providing a preferred embodiment of the present invention, the device 10 will be shown incorporated into a flashlight, however, the present invention also may be incorporated into any other lighting device such as architectural specialty lighting or vehicle lighting. In general, the present invention provides a means for packaging a high intensity LED lamp that includes integral heat sink capacity, electrical connectivity and an optical assembly for controlling the light output from the LED. The present invention therefore provides a convenient and economical assembly 10 for incorporating a high intensity LED into a lighting assembly that has not been previously available in the prior art.

Figure 2:
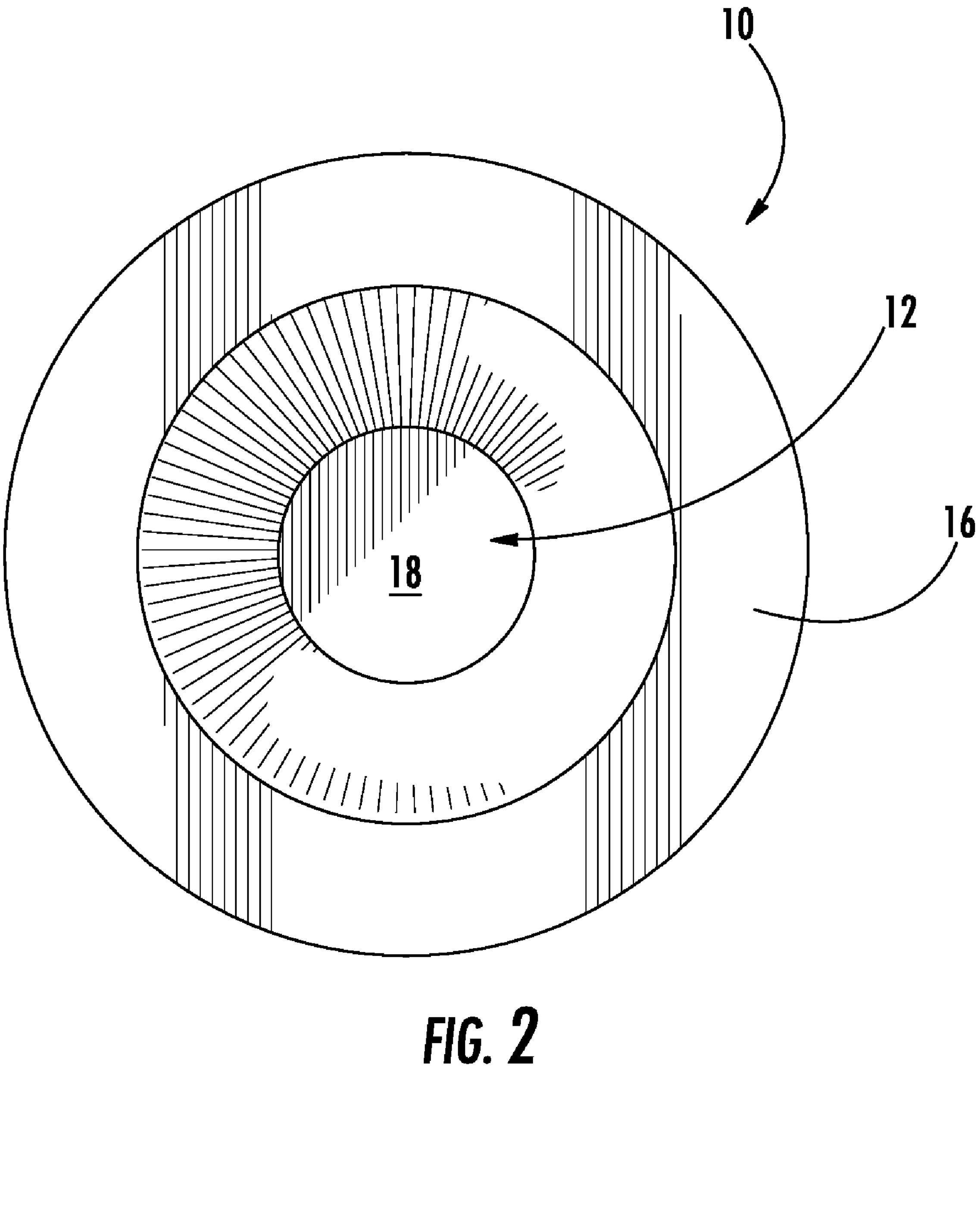
FIG. 2 is a front view thereof.
Figure 3:
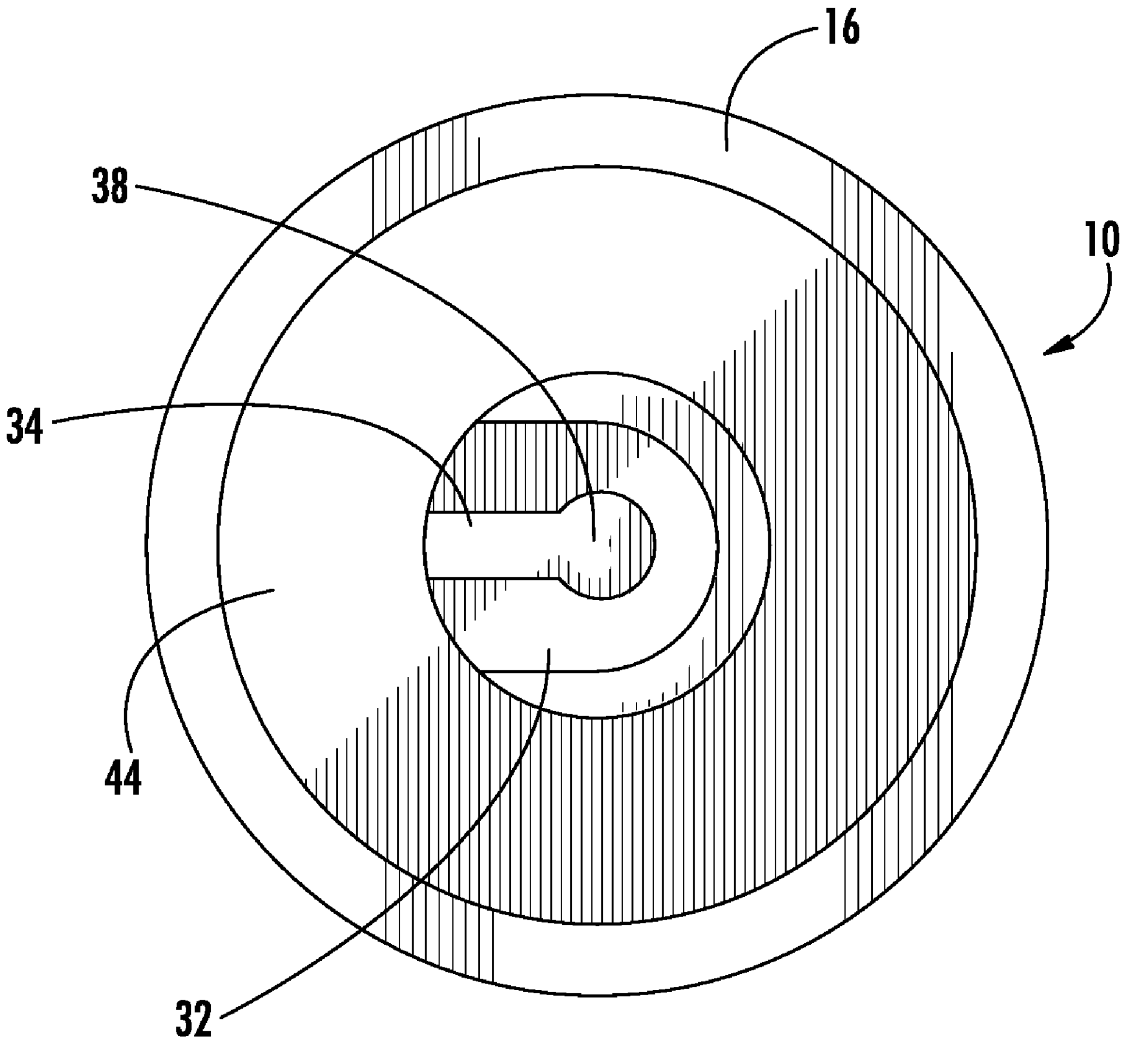
FIG. 3 is rear view thereof.

Turning to FIGS. 1, 2 and 3, the LED package assembly 10 can be seen in a fully assembled state. The three main components can be seen to include a high intensity LED lamp 12, an inner mounting die 14 and an outer enclosure 16. In FIGS. 1 and 2, the lens Portion 18 of the LED 12 can be seen extending through an opening in the front wall of the outer enclosure 16. Further, in FIG. 3 a rear view of the assembled package 10 of the present invention can be seen with a flexible contact strip shown extending over the bottom of the interior die 14.

Figure 4:
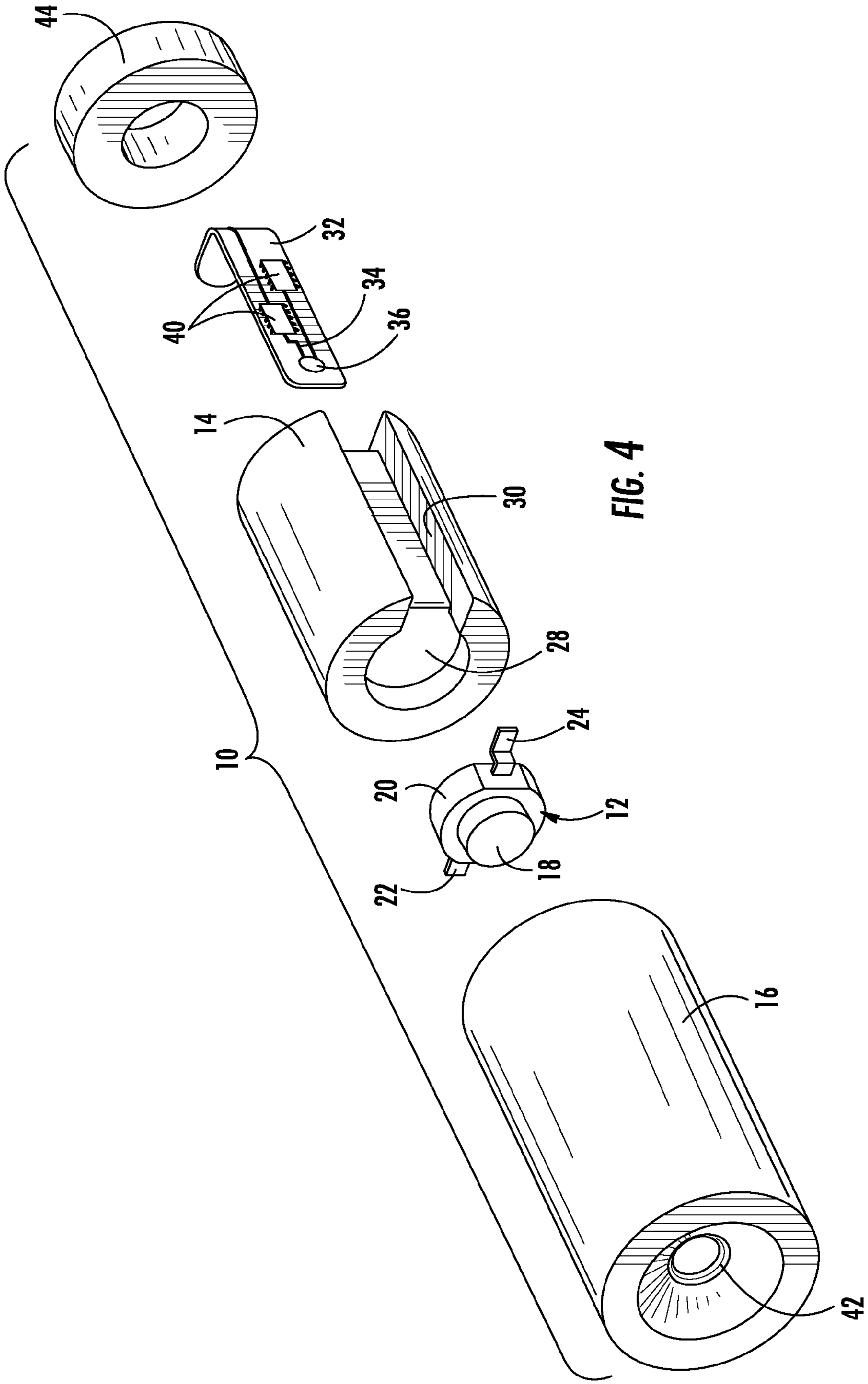
FIG. 4 is an exploded perspective thereof.
Figure 5:
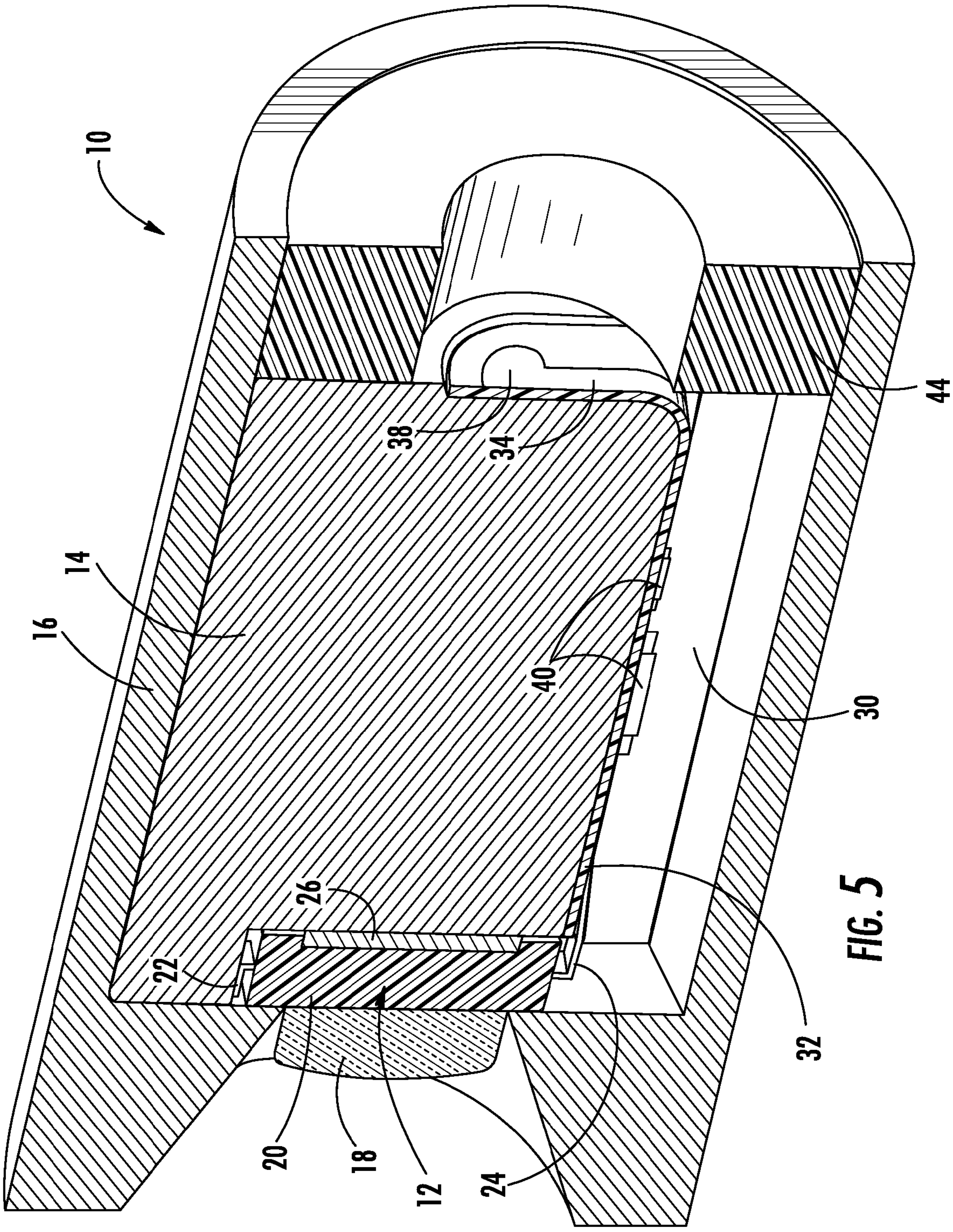
FIG. 5 is a cross-sectional view thereof as taken along line 5-5 of FIG. 1.
Figure 6:
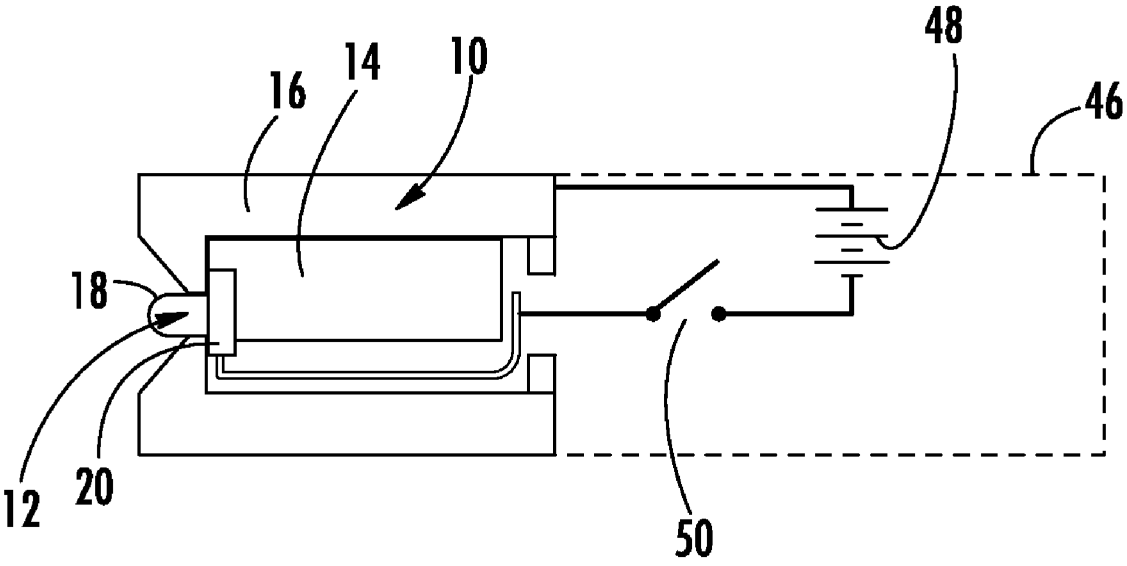
FIG. 6 is a schematic diagram generally illustrating the operational circuitry of present invention as incorporated into a complete lighting assembly.

Turning now to FIGS. 4 and 5, an exploded perspective view and a cross sectional view of the assembly 10 of the present invention can be seen. The assembly 10 of the present invention is specifically configured to incorporate a high intensity LED lamp 12 into a package that can be then used in a lighting assembly. The high intensity LED lamp 12 is shown here as a Luxeon Emitter assembly. However, it should be understood that the mounting arrangement described is equally applicable to other similarly packaged high intensity LED's. The LED 12 has a mounting base 20 and a lens portion 18 that encloses the LED 12 emitter chip (not shown). The LED 12 also includes two contact leads 22, 24 that extend from the sides of the mounting base 20, to which power is connected to energize the emitter chip. Further, the LED lamp 12 includes a heat transfer plate 26 positioned on the back of the mounting base 20. Since the emitter chip in this type of high intensity LED lamp 12 is four times the area of a standard emitter chip, a great deal more energy is consumed and a great deal more heat is generated. The heat transfer plate 26 is provided to transfer waste heat out of the LED lamp 12 to prevent malfunction or destruction of the chip. In this regard, the manufacturer has provided the heat transfer plate 26 for the specific purpose of engagement with a heat sink. However, all of the recommended heat sink configurations are directed to a planar circuit board mount with a heat spreader or a conventional finned heat sink. Neither of these arrangements is suitable for small package integration or a typical tubular flashlight construction.

In contrast, the mounting die 14 used in the present invention is configured to receive the LED lamp 12 and further provide both electrical and thermal conductivity to and from the LED lamp 12. The mounting die 14 is fashioned from a thermally conductive and electrically conductive material. In the preferred embodiment the mounting die 14 is fashioned from brass, however, the die 14 could also be fabricated from other metals such as aluminum or stainless steel or from an electrically conductive and thermally conductive polymer composition and still fall within the scope of this disclosure. The mounting die 14 has a recess 28 in one end thereof that is configured to frictionally receive and retain the base 20 of the LED lamp 12. While the base 20 and the recess 28 are illustrated as circular, it is to be understood that this recess is intended to receive the housing base regardless of the shape. As can be seen, one of the contact leads 22 extending from the base 20 of the LED lamp 12 must be bent against the LED lamp 12 base 20 and is thus trapped between the base 20 and the sidewall of the recess 28 when the LED lamp 12 is installed into the recess 28. When installed with the first contact lead 22 of the LED 12 retained in this manner, the lead 22 is in firm electrical communication with the mounting die 14. A channel 30 extends along one side of the mounting die 14 from the recess to the rear of the die 14. When the LED lamp 12 is installed in the mounting die 14, the second contact lead 24 extends into the opening in the channel 30 out of contact with the body of the mounting die 14. The heat transfer plate 26 provided in the rear of the LED lamp 12 base 20 is also in contact with the bottom wall of the recess 28 in the mounting die 14. When the heat transfer plate 26 is in contact with the die 14, the heat transfer plate 26 is also in thermal communication with the die 14 and heat is quickly transferred out of the LED lamp 12 and into the body of the die 14. The die 14 thus provides a great deal of added heat sink capacity to the LED lamp 12.

An insulator strip 32 is placed into the bottom of the channel 30 that extends along the side of the mounting die 14. The insulator strip 30 allows a conductor to be connected to the second contact lead 24 of the LED lamp 12 and extended through the channel 30 to the rear of the assembly 10 without coming into electrical contact with and short circuiting against the body of the die 14. In the preferred embodiment, the insulator strip 32 is a flexible printed circuit strip with circuit traces 34 printed on one side thereof. The second contact lead 24 of the LED lamp 12 is soldered to a contact pad 36 that is connected to a circuit trace 34 at one end of the insulator strip 32. The circuit trace 34 then extends the length of the assembly and terminated in a second contact pad 38 that is centrally located at the rear of the assembly 10. Further, control circuitry 40 may be mounted onto the flexible circuit strip 32 and housed within the channel 30 in the die 14. The control circuitry 40 includes an LED driver circuit as is well known in the art.

With the LED lamp 12 and insulator strip 32 installed on the mounting die 14, the mounting die 14 is inserted into the outer enclosure 16. The outer enclosure 16 is also fashioned from a thermally conductive and electrically conductive material. In the preferred embodiment the outer enclosure 16 is fashioned from brass, however, the outer enclosure 16 could also be fabricated from other metals such as aluminum or stainless steel or from an electrically conductive and thermally conductive polymer composition and still fall within the scope of this disclosure. The outer enclosure 16 has a cavity that closely matches the outer diameter of the mounting die 14. When the mounting die 14 is received therein, the die 14 and the housing 16 are in thermal and electrical communication with one another, providing a heat transfer pathway to the exterior of the assembly 10. As can also be seen, electrical connections to the assembly 10 can be made by providing connections to the outer enclosure 16 and the contact pad 38 on the circuit trace 34 at the rear of the mounting die 14. The outer enclosure 16 includes an aperture 42 in the front wall thereof through which the lens portion 18 of the LED lamp 12 extends. The aperture 42 is fashioned to provide optical control of the light emitted from the LED lamp 12. The aperture 42 in the preferred embodiment is shaped as a reflector cone and may be a simple conical reflector or a parabolic reflector. The walls of the aperture 42 may also be coated with an anti-reflective coating such as black paint or anodized to prevent the reflection of light, allowing only the image of the LED lamp 12 to be utilized in the finished lighting assembly.

Finally, an insulator disk 44 is shown pressed into place in the open end of the outer enclosure 16 behind the mounting die 14. The insulator disk 44 fits tightly into the opening in the outer enclosure 16 and serves to retain the mounting die 14 in place and to further isolate the contact pad 38 at the rear of the mounting die 14 from the outer enclosure 16.

Turning now to FIG. 6, a schematic diagram of a completed circuit showing the LED assembly 10 of the present invention incorporated into functional lighting device is provided. The LED assembly 10 is shown with electrical connections made thereto. A housing 46 is provided and shown in dashed lines. A power source 48 such as a battery is shown within the housing 46 with one terminal in electrical communication with the outer enclosure 15 of the LED assembly 10 and a second terminal in electrical communication with the contact pad 38 at the rear of the housing 16 via a switch assembly 50. The switching assembly 50 is provided as a means of selectively energizing the circuit and may be any switching means already known in the art. The housing 46 of the lighting device may also be thermally and electrically conductive to provide additional heat sink capacity and facilitate electrical connection to the outer enclosure 16 of the LED assembly 10.

Figure 7:
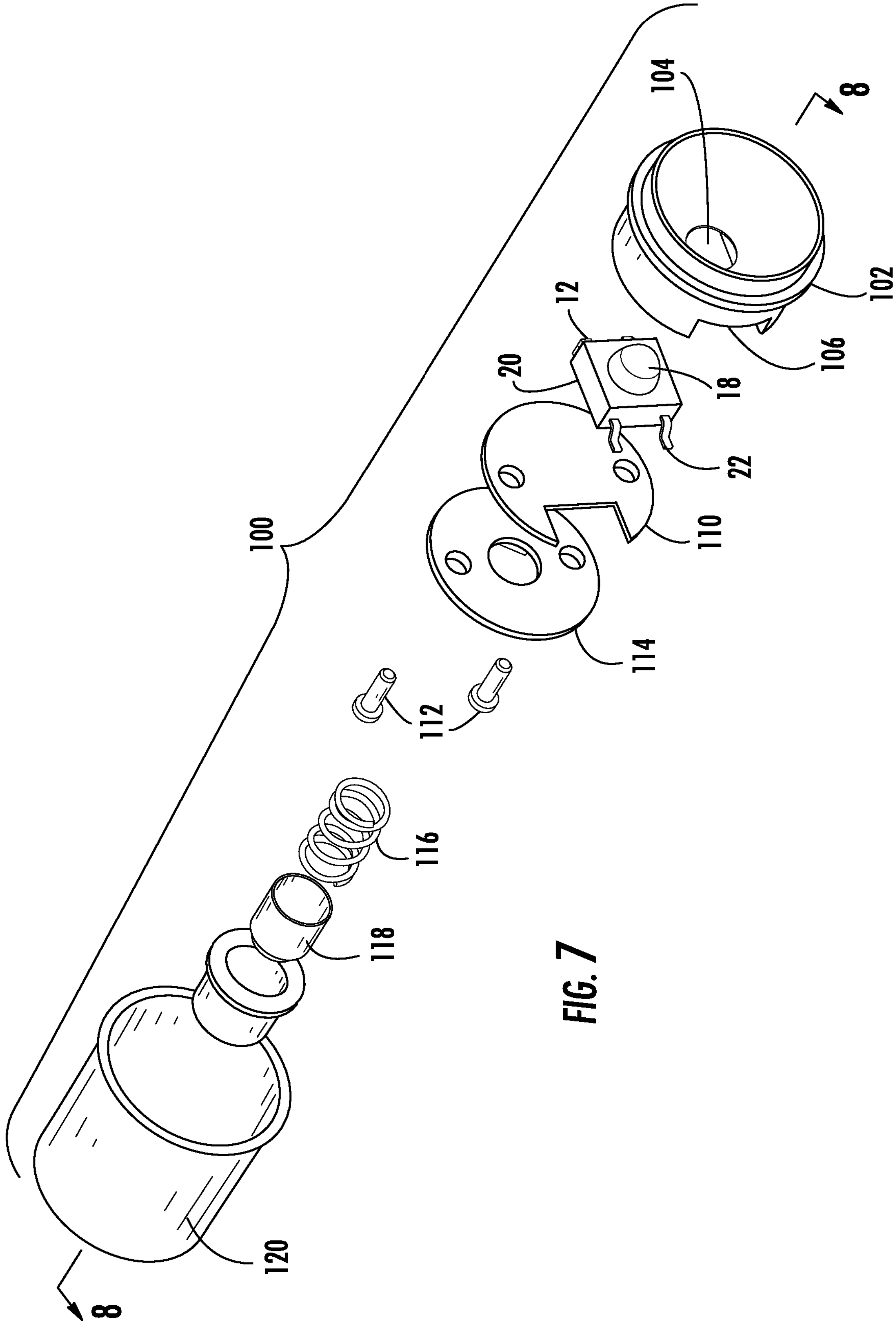
FIG. 7 is an exploded perspective view of a first alternate embodiment of the present invention.
Figure 8:
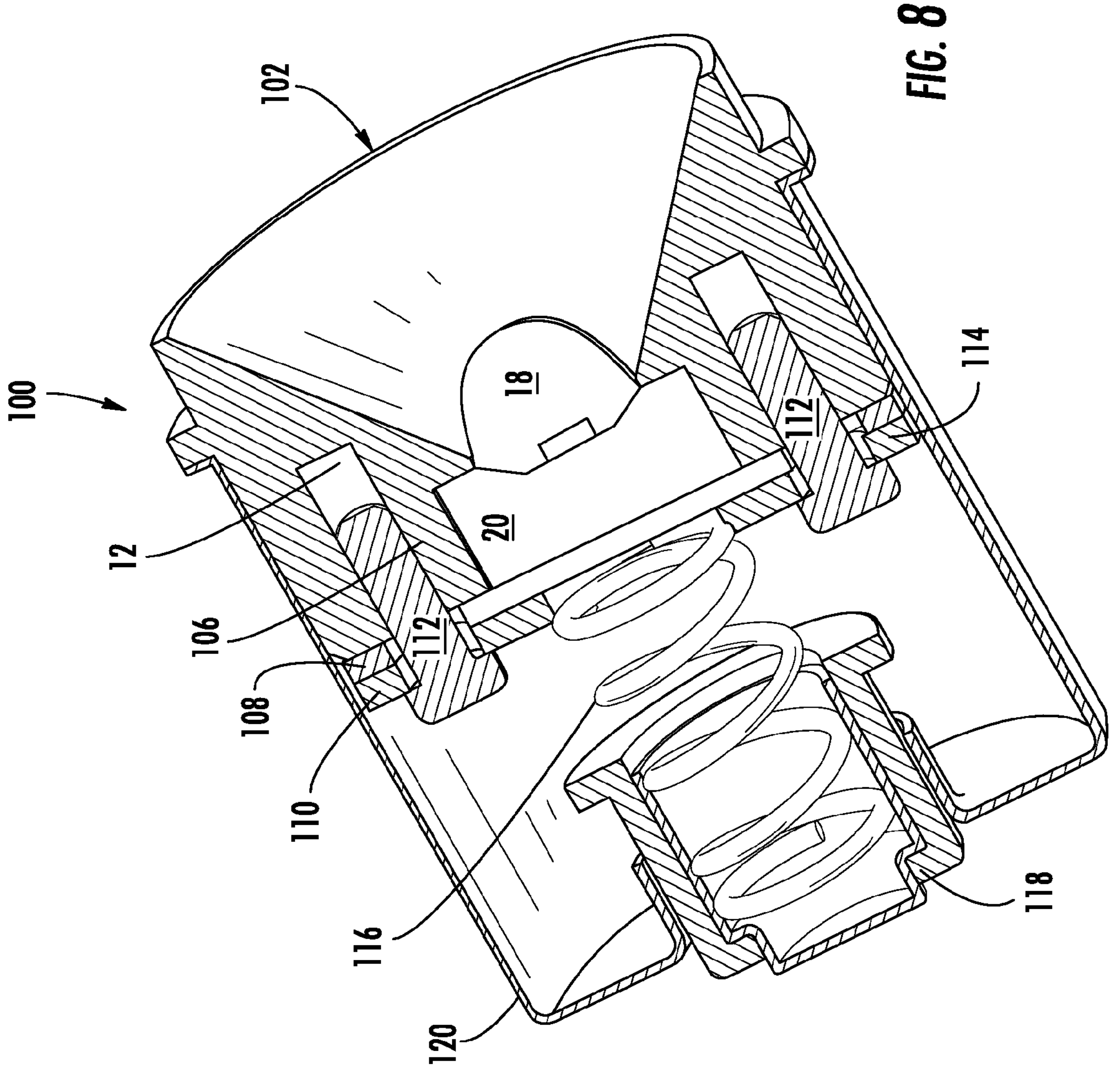
FIG. 8 is a cross-sectional view thereof as taken along line 8-8 of FIG. 7.

Turning to FIGS. 7 and 8, an alternate embodiment of the LED assembly 100 is shown the outer enclosure is a reflector cup 102 with an opening 104 in the center thereof. The lens portion 18 of the LED 12 is received in the opening 104. The reflector cup 102 includes a channel 106 that is cleared in the rear thereof to receive the mounting base 20 of the LED 12 wherein the rear surface of the mounting base 20 is substantially flush with the rear surface 108 of the reflector cup 102 when the LED in 12 is in the installed position. The mounting die is replaced by a heat spreader plate 110. The spreader plate 110 is in thermal communication with both the heat transfer plate on the back of the LED 12 and the rear surface 108 of the reflector cup 102. In this manner when the LED 12 is in operation the waste heat is conducted from the LED 12 through the spreader plate 110 and into the body of the reflector cup 102 for further conduction and dissipation. The spreader plate 110 may be retained in its operative position by screws 112 that thread into the back 108 of the reflector cup 102. Alternatively, a thermally conductive adhesive (not shown) may be used to hold the LED 12, the reflector cup 102 and the spreader plate 110 all in operative relation.

FIGS. 7 and 8 also show the installation of a circuit board 114 installed behind the spreader plate 110. The circuit board 114 is electrically isolated from the spreader plate 110 but has contact pads thereon where the electrical contacts 22 of the LED 12 can be connected. Further a spring 116 may be provided that extends to a plunger 118 that provides an means for bringing power from one battery contact into the circuit board 114. Power from the second contact of the power source may be conducted through the outer housing 120 and directed back to the circuit board. While specific structure is shown to complete the circuit path, it can be appreciated that the present invention is primarily directed to the assembly including merely the reflector cup 102, the LED 12 and the spreader plate 110.

Figure 9:
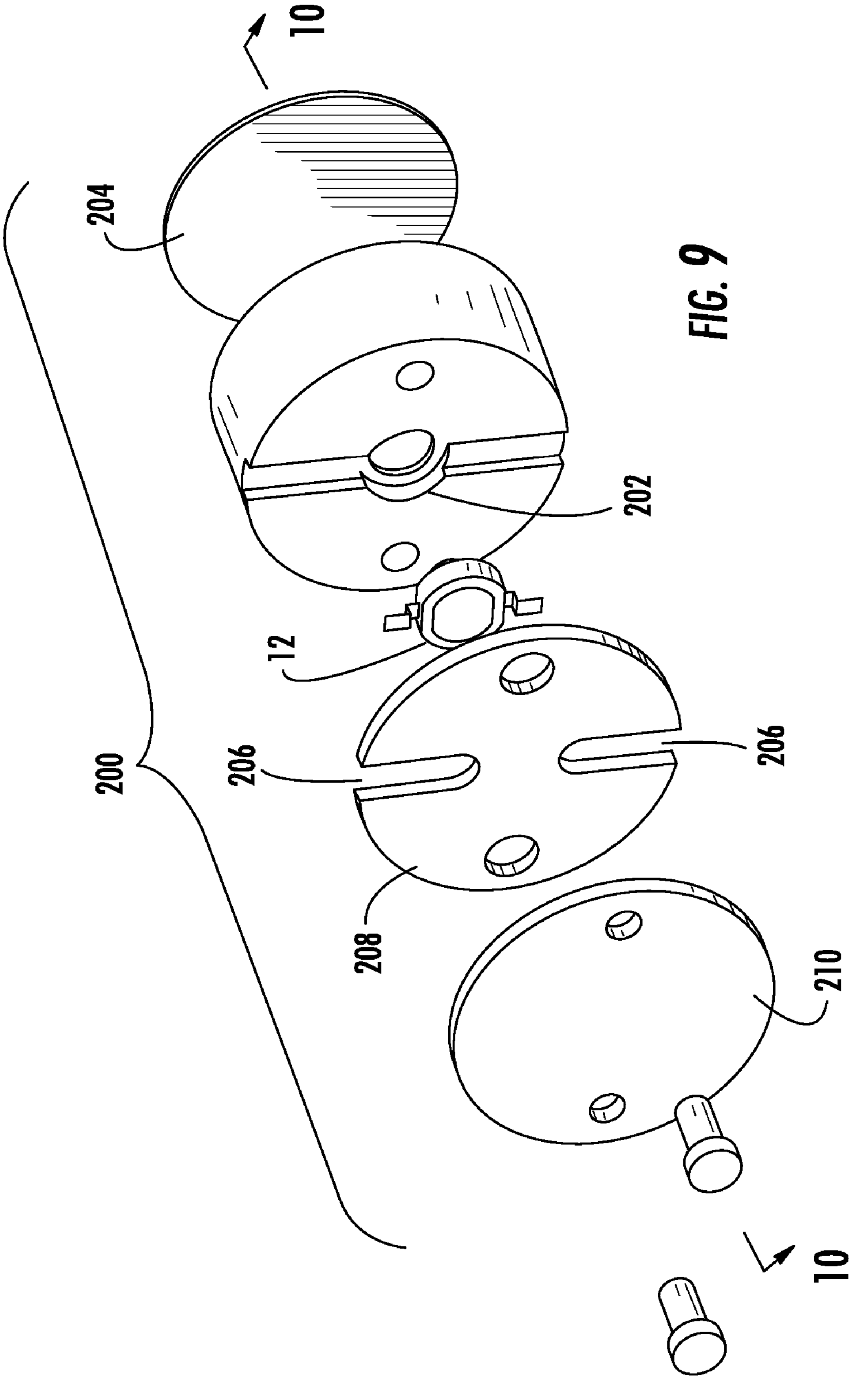
FIG. 9 is an exploded perspective view of a second alternate embodiment of the present invention.
Figure 10:
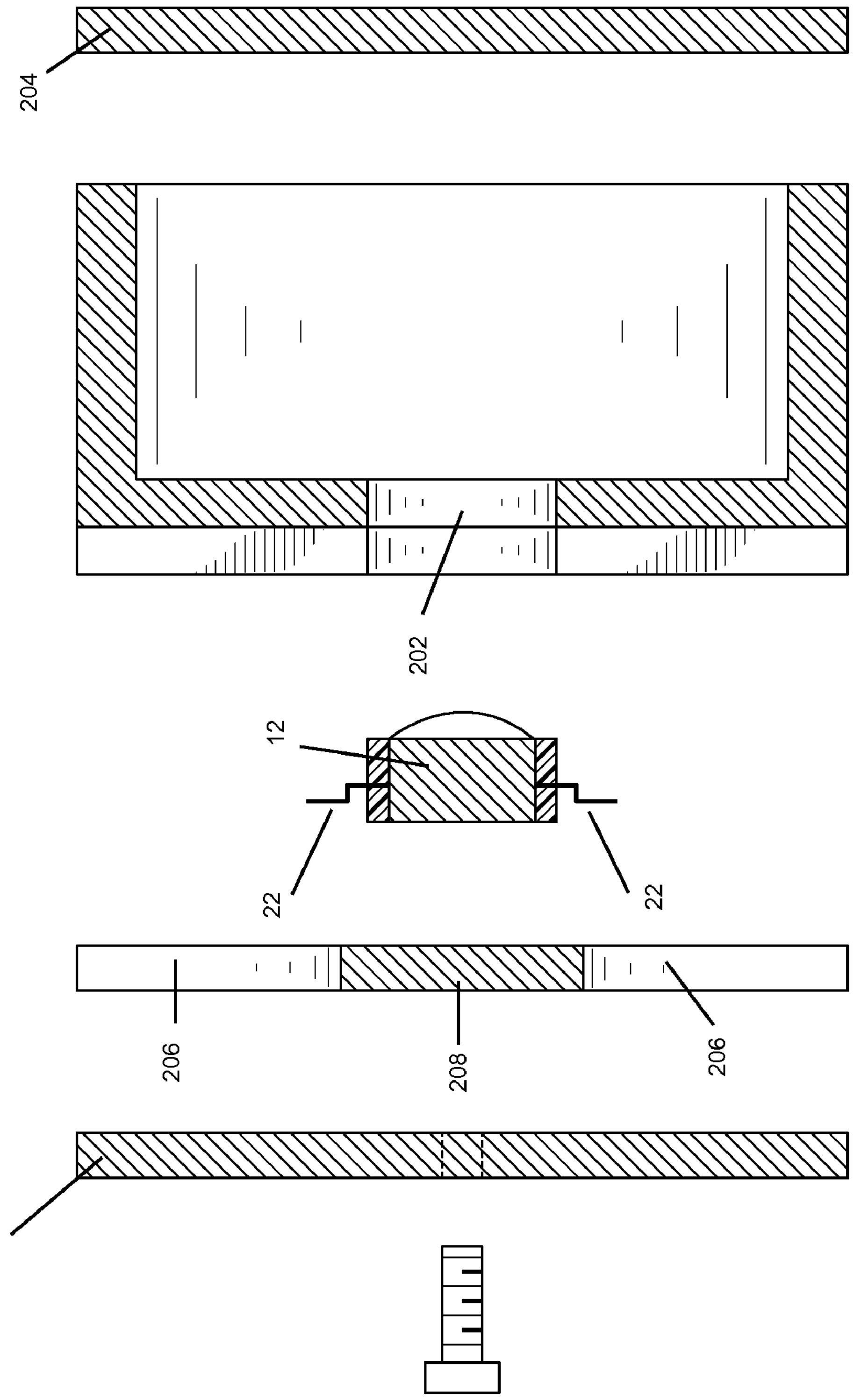
FIG. 10 is a cross-sectional view thereof as taken along line 10-10 of FIG. 9.

Turning now to FIGS. 9 and 10, a second alternate embodiment is shown where the slot is replaced with a circular hole 202 that receives a Luxeon type LED 12 emitter. Further, a lens 204 is shown for purposes of illustration. In all other respects this particular embodiment is operationally the same as the one described above. It should be note that relief areas 206 are provided in the spreader plate 208 that are configured to correspond to the electrical leads 22 of the LED 12 being used in the assembly. In this manner, the contacts 22 can be connected to the circuit board 210 without contacting the spreader plate 208.

Figure 11:
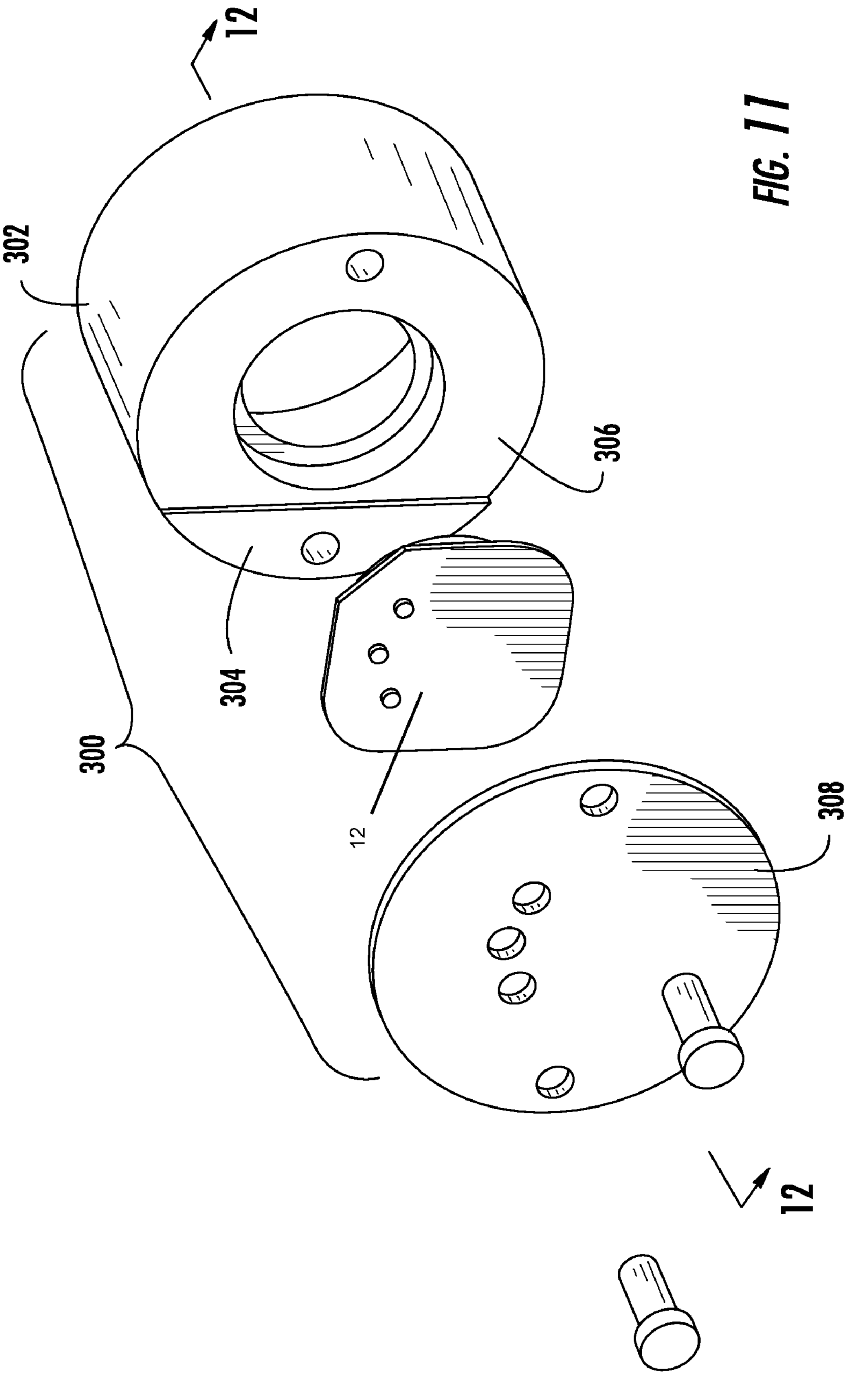
FIG. 11 is an exploded perspective view of a third alternate embodiment of the present invention.
Figure 12:
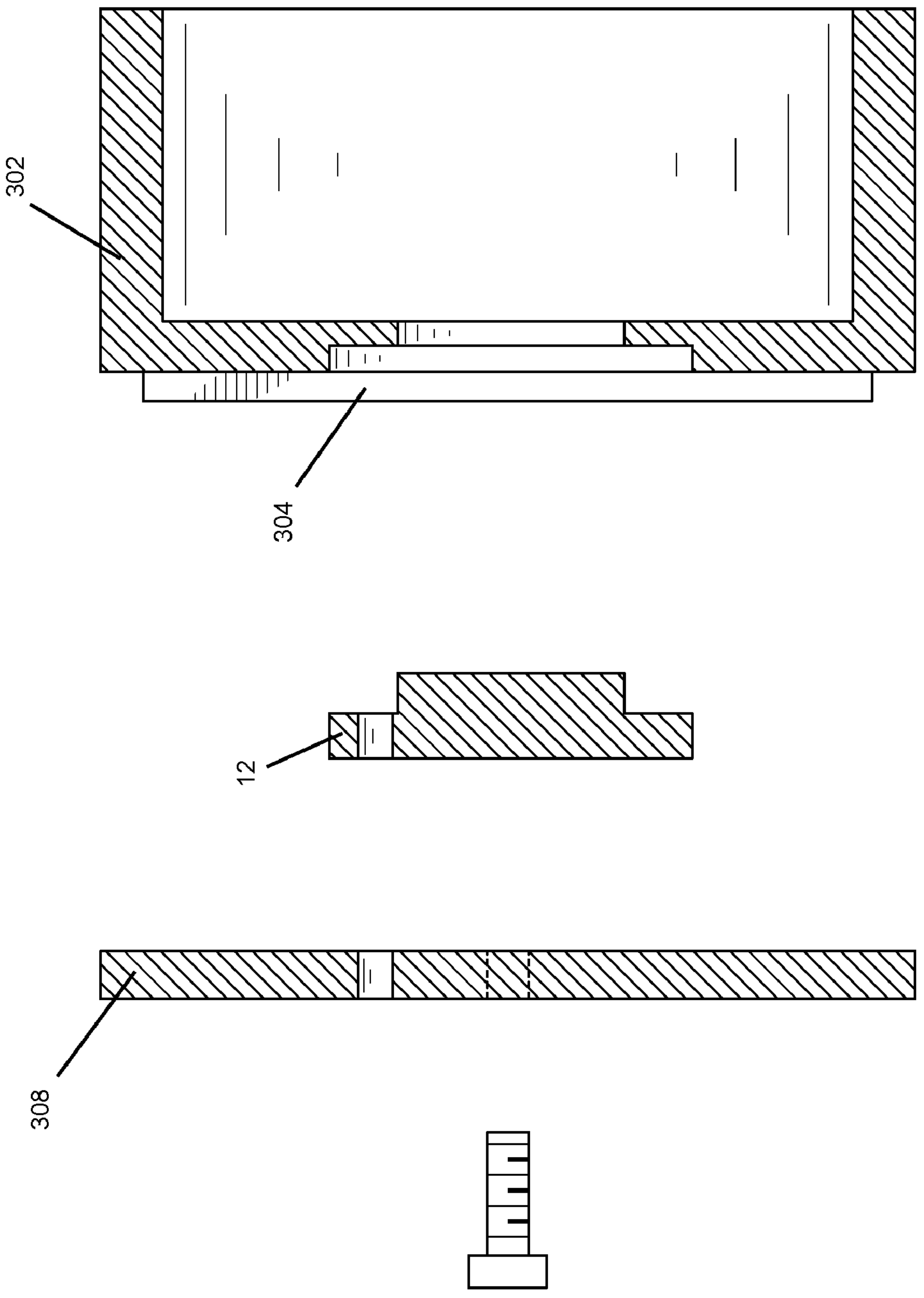
FIG. 12 is a cross-sectional view thereof as taken along line 12-12 of FIG. 11.

Turning to FIGS. 11 and 12, a third alternate embodiment of the LED assembly 300 is shown. The reflector cup 302 includes both a circular hole 304 and a slot 306 in the rear thereof. The important aspect of the present invention is that the spreader plates 110, 210 or 308 are in flush thermal communication with both the rear surface of the LED 12 and the rear surface of the reflector cups 102, 200 and 302 to allow the heat to be transferred from the LED 12 to the reflector cup 102, 200 and 302.

Figure 13:
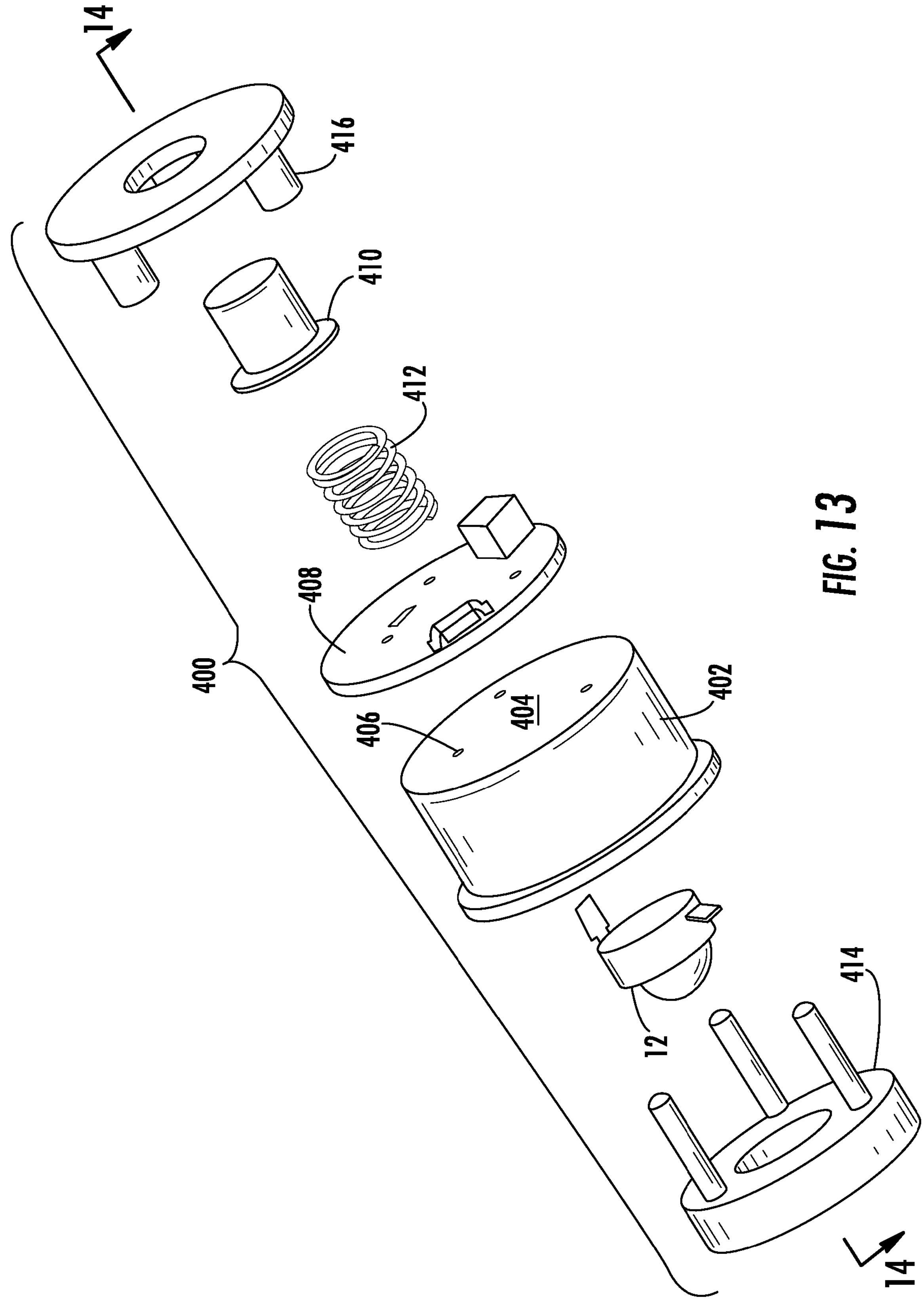
FIG. 13 is an exploded perspective view of a fourth alternate embodiment of the present invention.
Figure 14:
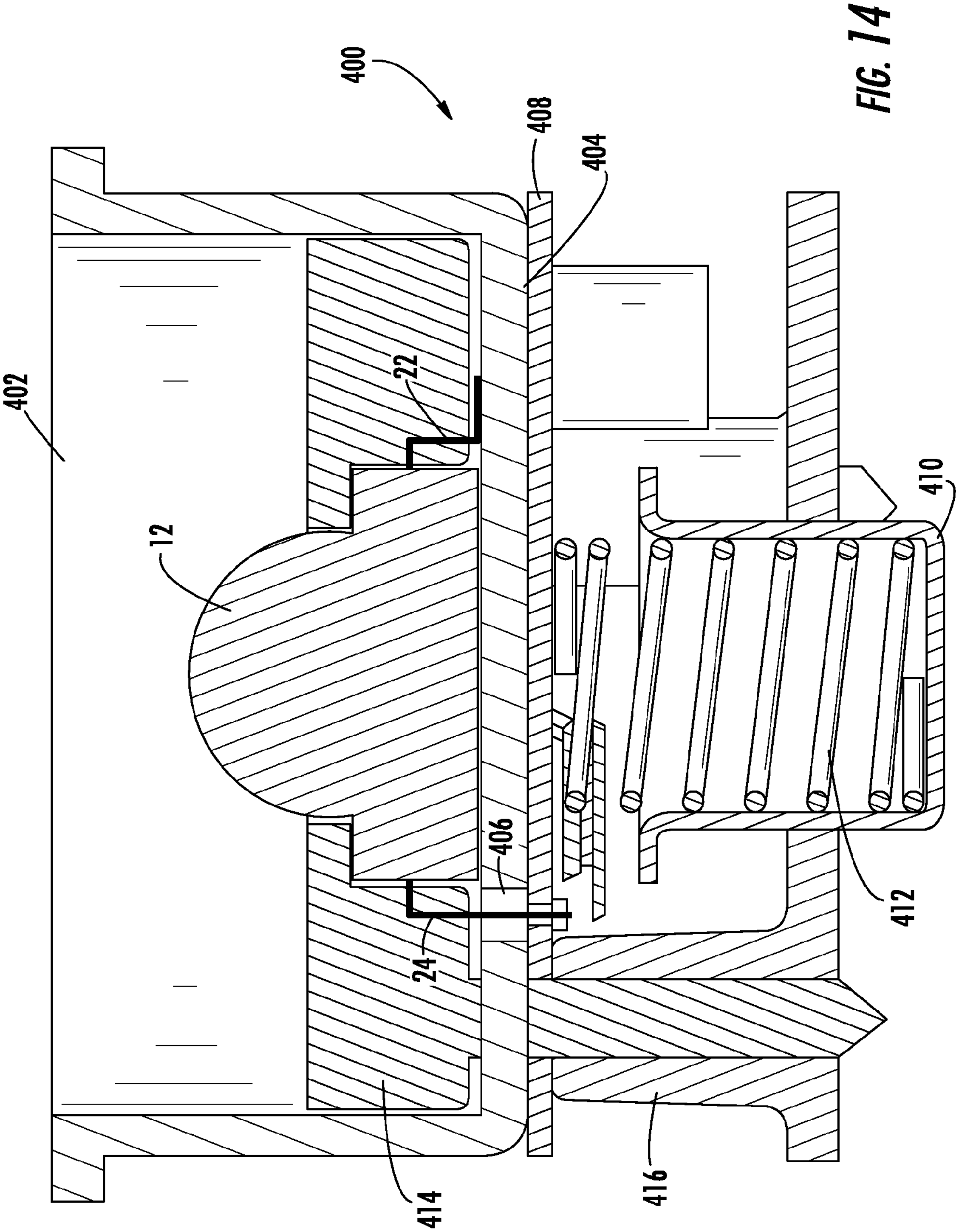
FIG. 14 is a cross-sectional view thereof as taken along line 14-14 of FIG. 13.

Turning to FIGS. 13 and 14, a fourth alternate embodiment of the LED assembly 400 is shown. The reflector cup 402 is configured to receive the entire LED 12 within the front of the reflector cup 402. The important aspect of the present invention is that the reflector cup 402 is metallic and thermal and electrically conductive. The rear surface of the LED 12 and one contact 22 thereof are in contact rear wall 404 of the reflector cup 402. In this manner, the reflector cup 402 provides both means for heat transfer from the LED 12 and electrical conductivity to one lead 22 of the LED 12. The second lead 24 of the LED 12 extends through a hole 406 in the reflector cup 402 and is in electrical communication with the circuit board 408. A battery contact 410 and spring 412 transfer electricity from one terminal of the power source to the rear of the circuit board 408 while power from the other terminal is introduced into the reflector cup 402 and to the front of the circuit board 408. The entire subassembly is connected together using plastic retainers 414 and 416 and heat staked together to provide a completed assembly 400.

Figure 15:
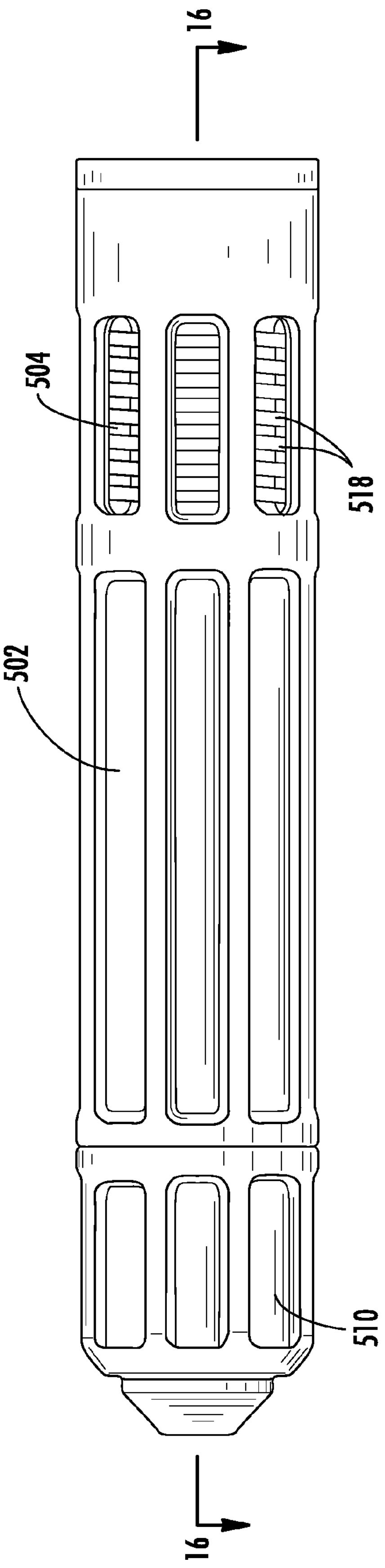
FIG. 15 is a perspective view of the LED lighting assembly installed into the ventilated housing of the present invention.

FIGS. 15-18 illustrate another alternate embodiment of the LED assembly 500 with improved heat management of the present invention. This embodiment utilizes any one of the foregoing packaged head assemblies and incorporates the head assembly 500 into a novel housing 502 for use in a finished device such as a flashlight. Similarly, while FIG. 15 illustrates a flashlight it can be appreciated by one skilled in the art that a variety of housings 502 could be utilized to allow the assembly to be incorporated into any lighting environment. Further, the housing 502 may be thermally conductive and formed from a material such as aluminum or stainless steel. Further, by manufacturing the housing 502 and LED assembly 500 in accordance with the present disclosure, the housing 502 may be a nonconductive material such as a polymer. The important feature of the housing 502, as can be best seen in FIG. 15, is the provision of vent openings 504 in the side walls of the housing 502. The vent openings 504 in the side of the housing 502 are placed in a location so as to correspond to and align with the outer enclosure 506 of the LED assembly 500. In this manner, the heat being dissipated by the outer enclosure 506 of the LED assembly 500 is exposed to free and circulating air. Specifically, air is allowed to flow freely into the flashlight housing 502 via the vent openings 504 provided therein to conduct waste heat away from the LED head assembly 500. This feature allows for enhanced heat management and dissipation thereby providing a high intensity LED lighting assembly with increased performance and reliability.

Figure 16:
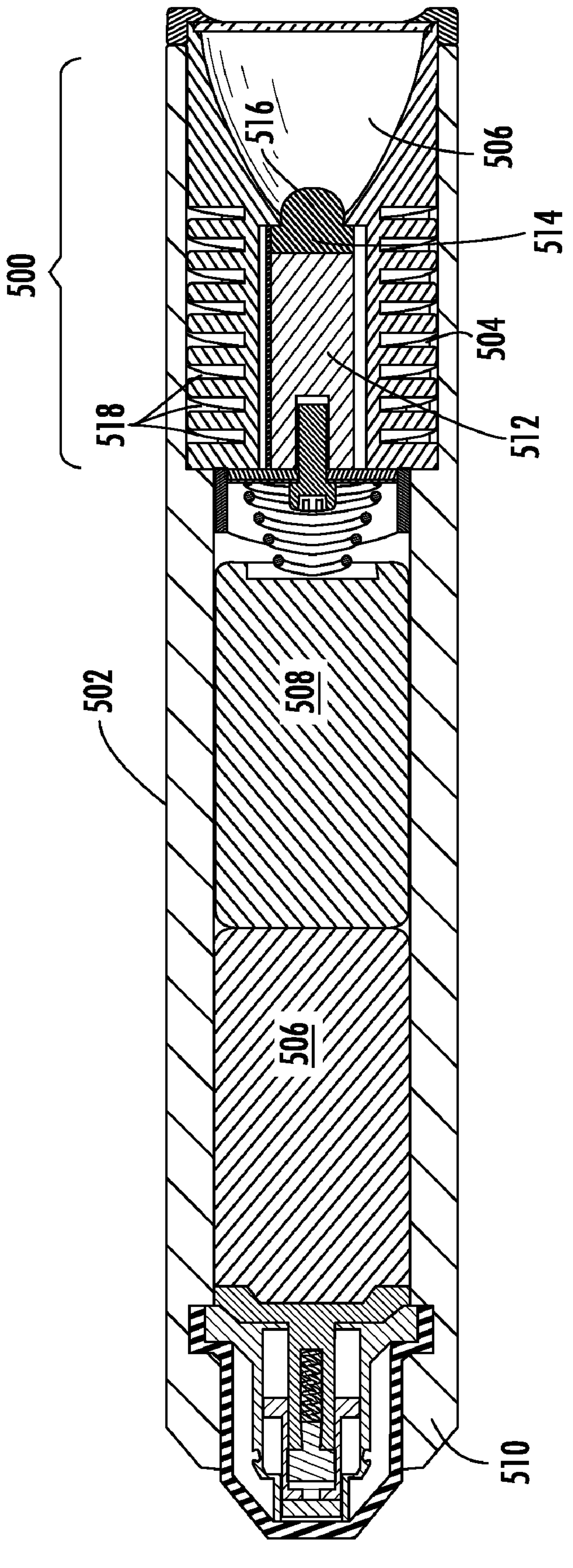
FIG. 16 is a cross-sectional view thereof as taken along line 16-16 of FIG. 15.

FIG. 16 shows a cross-sectional view take through the flashlight of the present invention. As can be seen, the housing 502 is configured to receive a LED lighting assembly 500 into one end thereof. The opposite end of the housing 502 receives and encloses a power source 508 such as batteries and an end cap 510 that also includes the operable elements necessary to provide multi-function switching. As was stated above, while a flashlight is shown, the present invention can also be utilized in other environments that may include hard wired connections. In those cases the rear of the housing 502 would be modified to accommodate power connections to line voltage such as 120 volt residential supply voltage or the low voltage supply side of a transformer.

Figure 17:
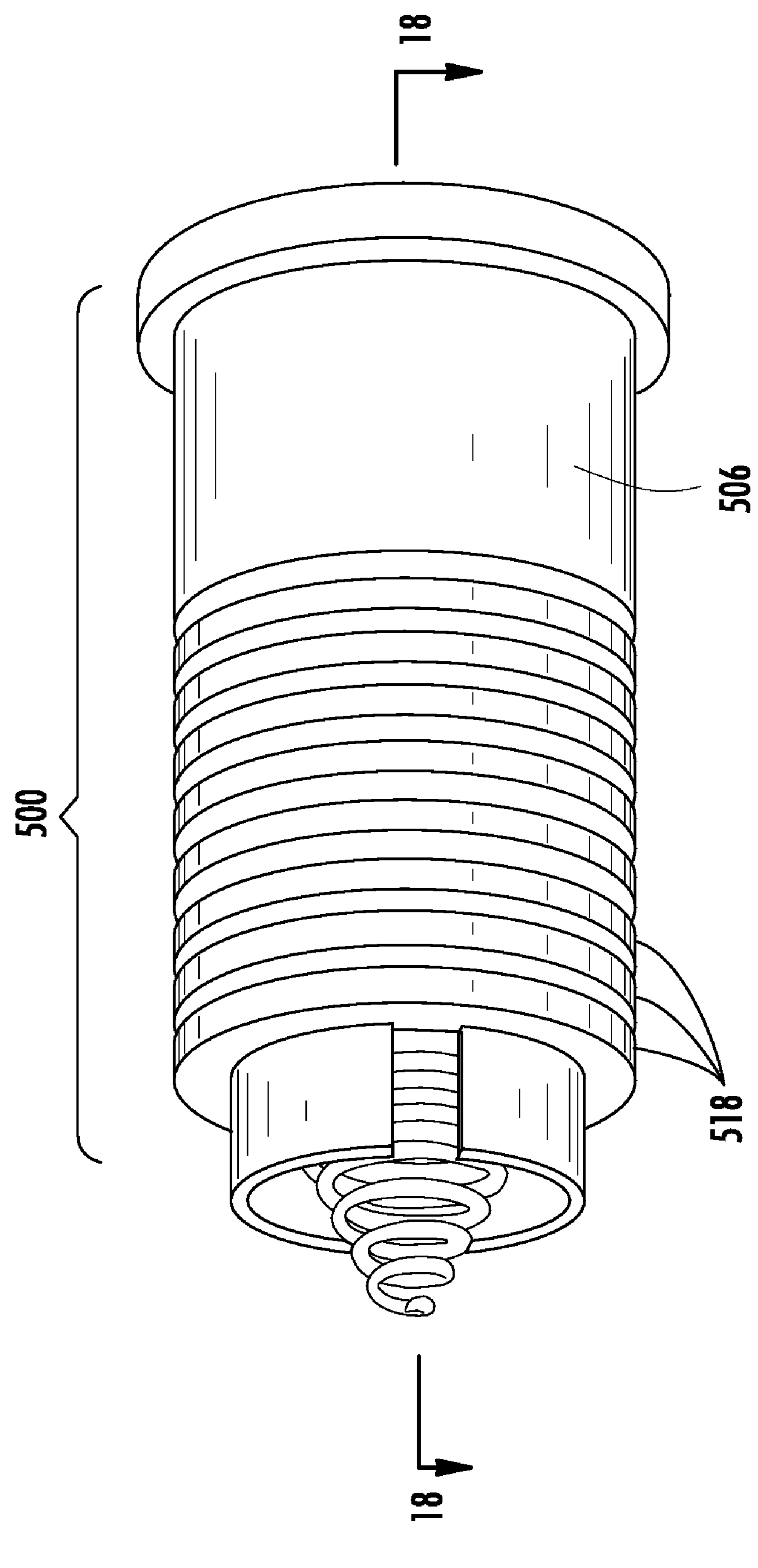
FIG. 17 is a perspective view of the LED head assembly removed from the ventilated housing of the present invention.
Figure 18:
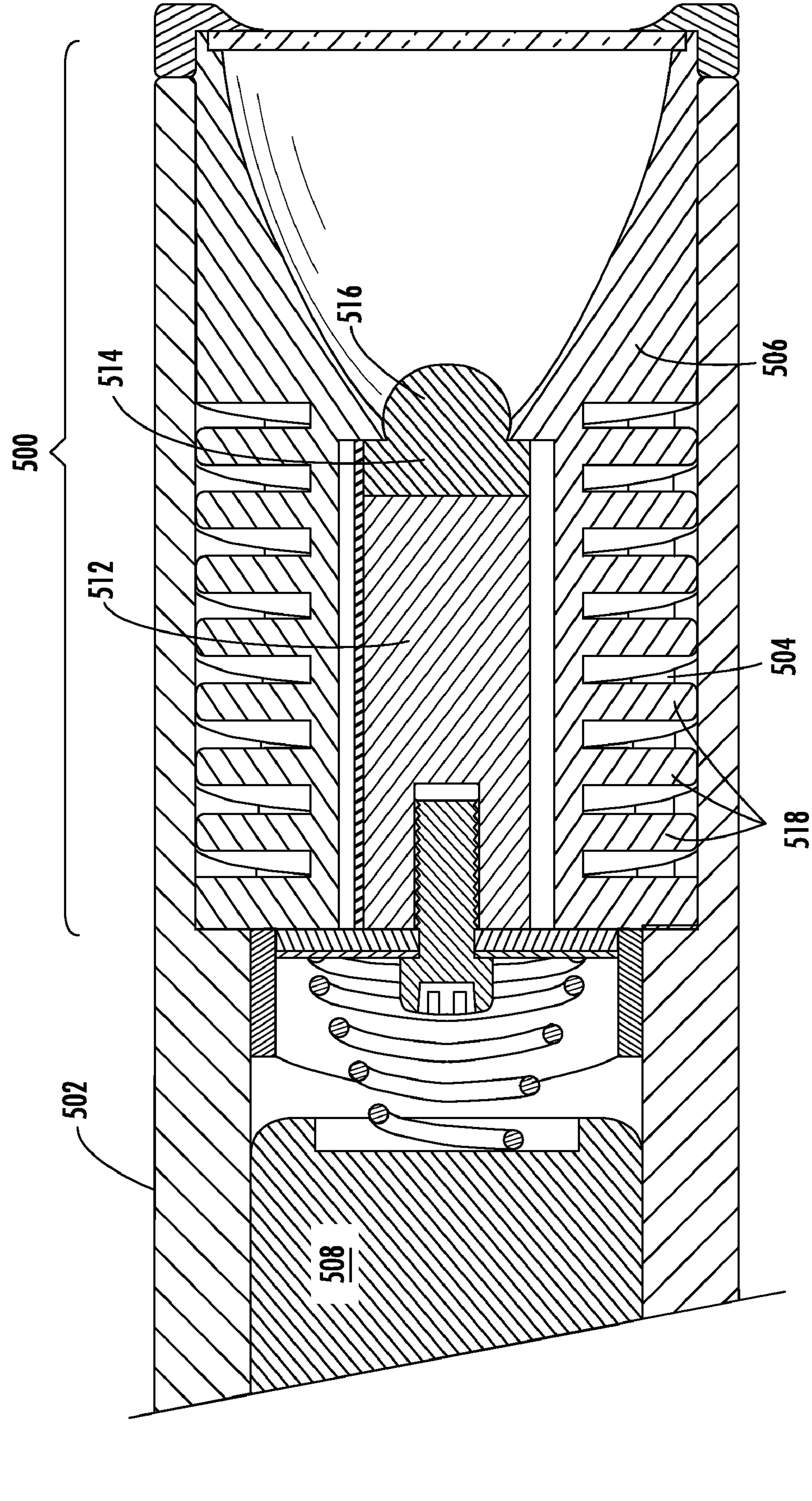
FIG. 18 is a cross-sectional view thereof as taken along line 18-18 of FIG. 17.

Turning now to FIGS. 17 and 18, the particularly novel features associated with the present invention are shown and illustrated. A fifth alternate embodiment of the LED assembly 500 is shown. As described above, a mounting die 512 is provided as the central element of the assembly. The mounting die 512 is both thermally and electrically conductive and includes a receiving end to which the high powered LED 514 is mounted with the heat transfer plate in contact with the mounting die 512. In this manner, heat is conducted directly from the LED 514 into the mounting die 512. The exterior enclosure 506 is a thermally conductive material that includes an opening in the rear to receive the mounting die 512 with the LED 514 mounted thereon. The exterior enclosure 506 includes an opening in the opposite end thereof to allow the optical element 516 of the LED 514 to extend therethrough. Further, the exterior enclosure 506 is configured to surround the entire mounting die 512 providing a large contact surface area for heat transfer. The outer surface of the exterior enclosure 506 is further modified with surface area enhancements 518. The surface area enhancements 518 are shown as substantially concentric disk shaped fins extending outwardly from the wall of the exterior enclosure 506. While the surface area enhancements 518 are shown as disk shaped fins, clearly they also could be spiral, longitudinal or oblique fins. Further the surface area enhancements 518 could also be pins or ribs and still fall within the present disclosure. The surface area enhancements 518 are placed on the outer wall of the exterior enclosure 506 so as to correspond with the vent openings 504 in the side wall of the outer housing 502. In this manner, cooling air is allowed to circulate in through the openings 504 in the side wall 502, around the surface area enhancements 518 to collect waste and then back out through the vent openings 504. In this manner the heat management properties of the present invention are greatly enhanced as compared to the flashlights of the prior art. It is the placement of the vent openings 504 in close proximity adjacent to the thermally conductive exterior enclosure 506 that allows free air flow and effective cooling of the LED assembly 500 that makes the present invention more effective that similar devices found in the prior art.

Figure 19:
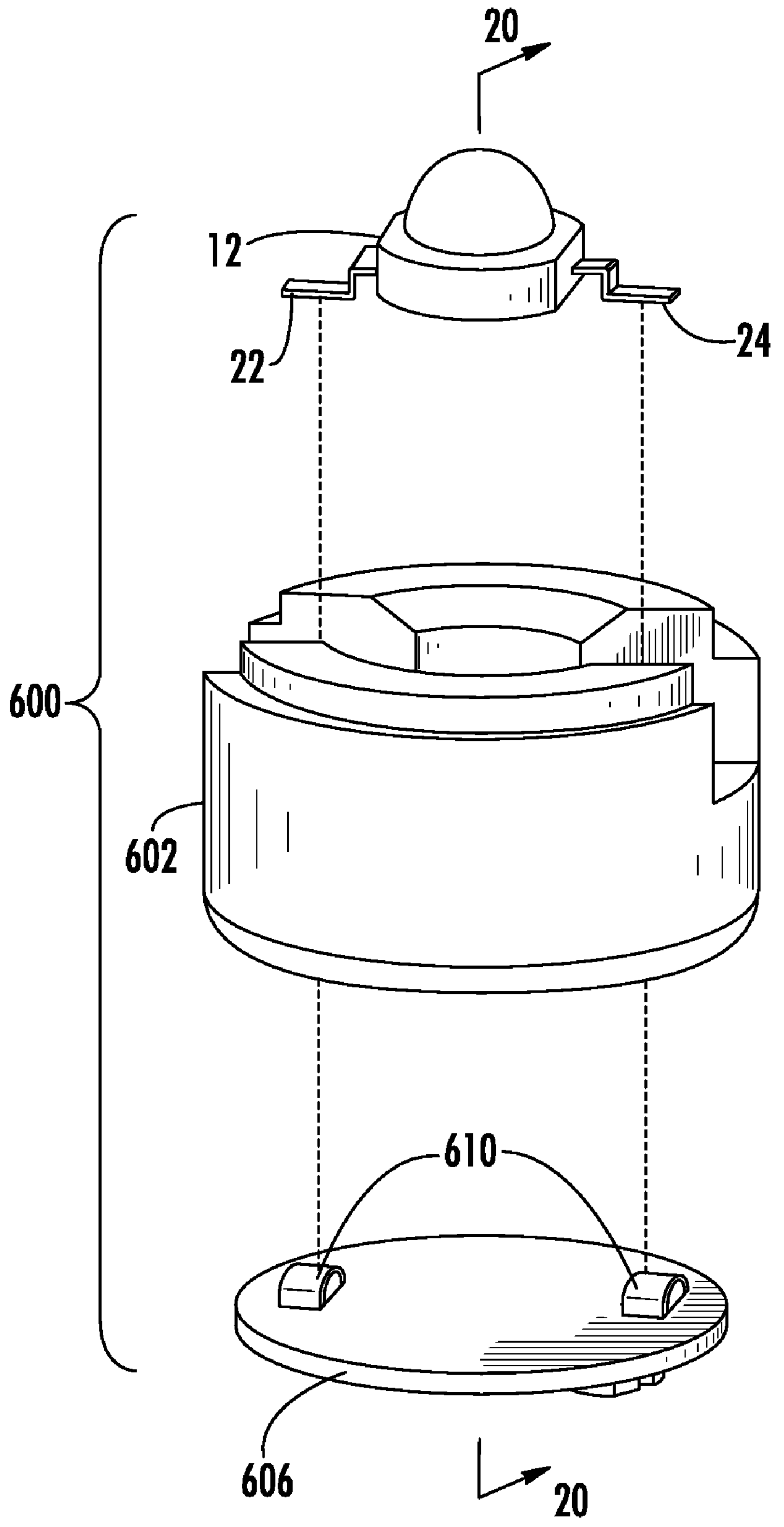
FIG. 19 is an exploded perspective view of a fifth alternate embodiment of the present invention.
Figure 20:
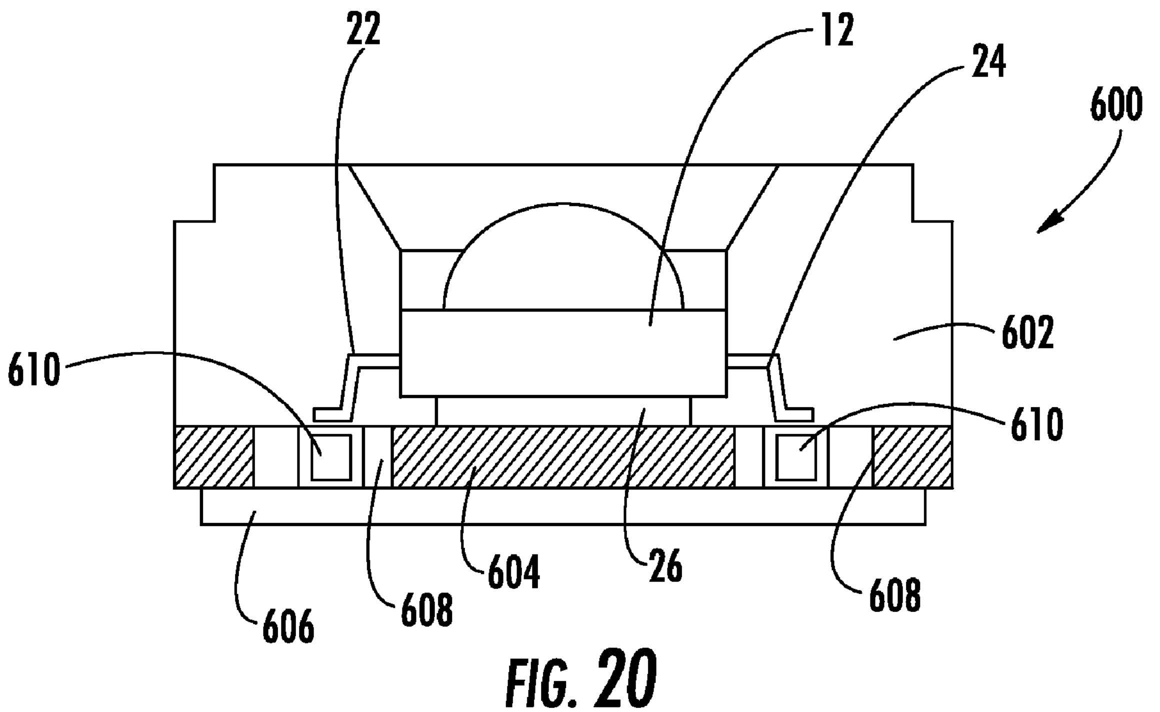
FIG. 20 is a cross-sectional view thereof as taken along line 20-20 of FIG. 19.

Turning to FIGS. 19 and 20, a fifth alternate embodiment of the LED assembly 600 is shown. The reflector cup 602 as described above is again configured to receive the entire LED 12 within the front of the reflector cup 602. The important aspect of the present invention is that the reflector cup 602 is highly thermally conductive. When the LED 12 is placed into the reflector cup 602, the heat transfer plate 26 on the rear surface of the LED 12 are in contact with the rear wall 604 of the reflector cup 602. In this manner, the reflector cup 602 provides means for effective heat transfer from the LED 12. In order to enhance the thermal transfer pathway from the heat transfer plate 26 into the rear wall 604 and subsequently into the body of the reflector cup 602, the rear wall 604 must have a substantial thickness. However in providing a rear wall 604 with a sufficient thickness to increase the thermal transfer pathway, a means for making electrical connections between the leads 22, 24 of the LED 12 and the circuit board 606 also must be provided. In the prior art, the leads 22, 24 would be bend down into the holes 608 in the rear wall 604 of the reflector cup 602 and soldered to the circuit board 606. However, by bending the leads 22, 24 in this manner significant stress is introduced to the LED 12 and difficult conditions are created for making the required solder connection ultimately increasing the failure and defect rates of the overall head assembly 600. To overcome these difficulties the present invention provides for risers 610 to be installed directly onto the circuit board 606 before the circuit board is mated to the reflector cup 602. The risers 610 are electrically conductive members that are connected to the circuitry on the circuit board 606 and have a height that corresponds to the thickness of the rear wall 604 of the reflector cup 602. In this manner when the circuit board 606 is installed into position behind the reflector cup 602, the risers extend upwardly through the holes 608 in the rear wall 604 of the reflector cup 602 and are positioned flush with the interior surface of the rear wall 604 of the reflector cup to provide a convenient contact pad to which the LED 12 leads 22, 24 can be soldered. In addition to soldering, the leads 22, 24 may be connected to the riser members using mechanical fasteners or electrically conductive adhesive. In this manner, the LED 12 leads 22, 24 are soldered onto the risers 610 without having to bend the leads 24, 24. Further, the solder connection is easily accessible as compared to the prior art methods.

Figure 21:
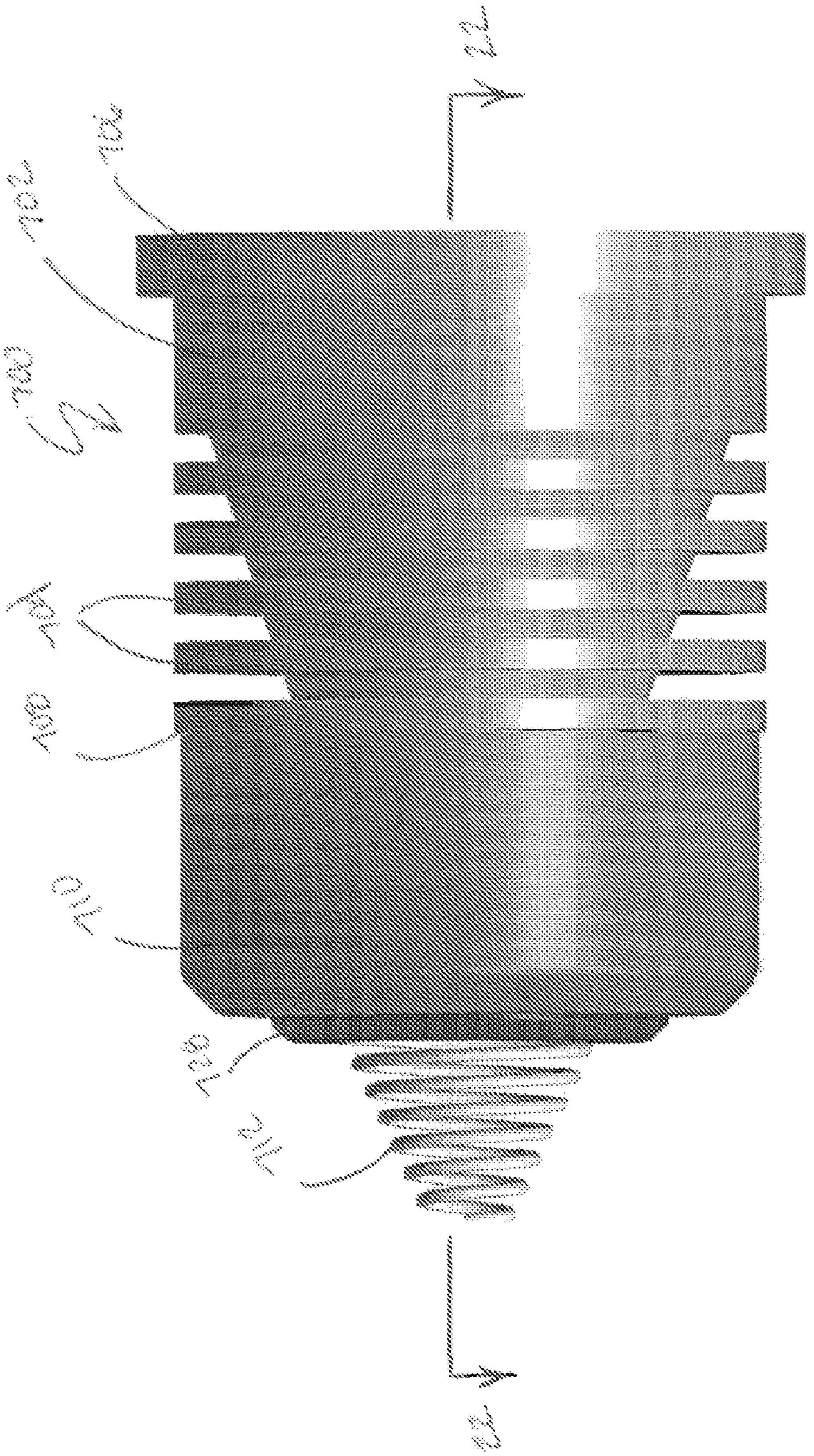
FIG. 21 is a side view of a sixth alternate embodiment of the present invention.
Figure 22:
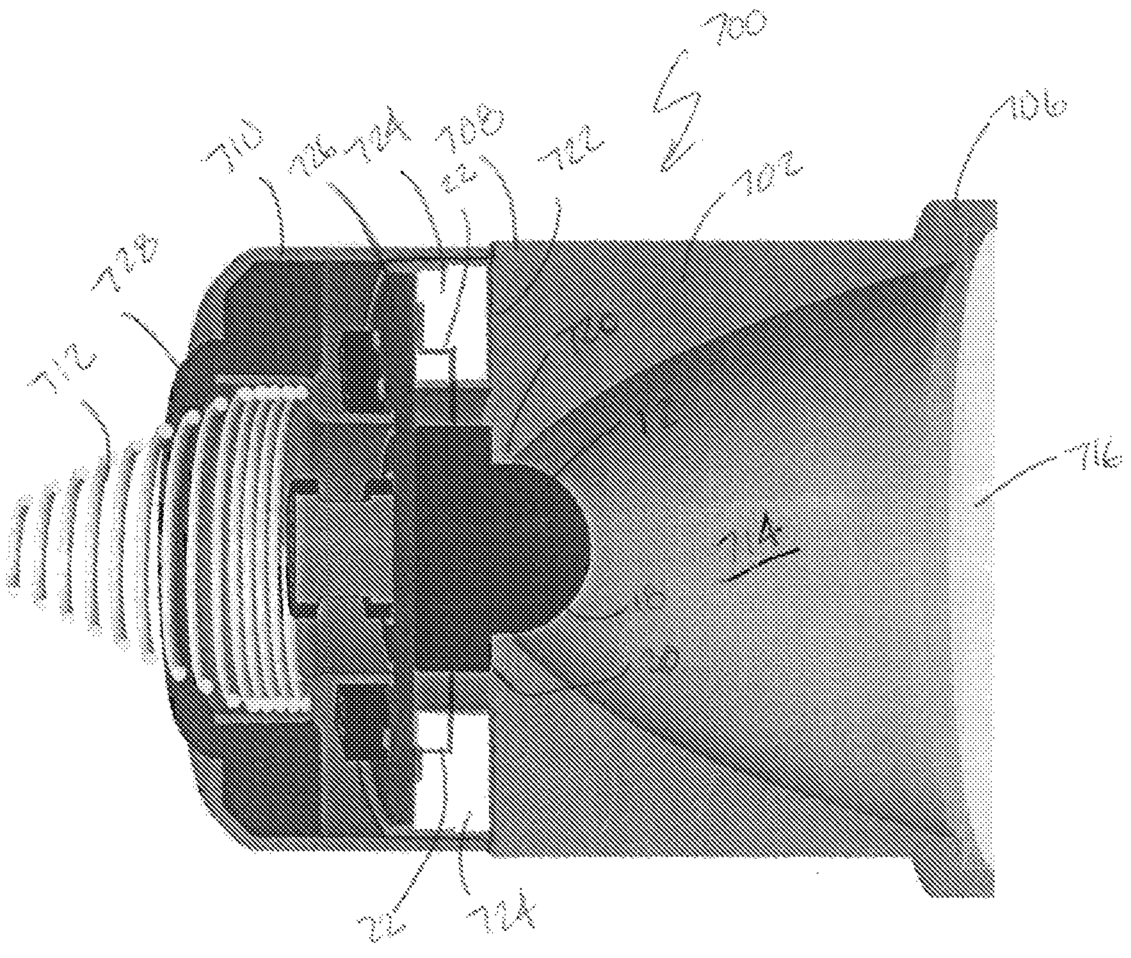
FIG. 22 is a cross-sectional view thereof as taken along line 22-22 of FIG. 21.
Figure 23:
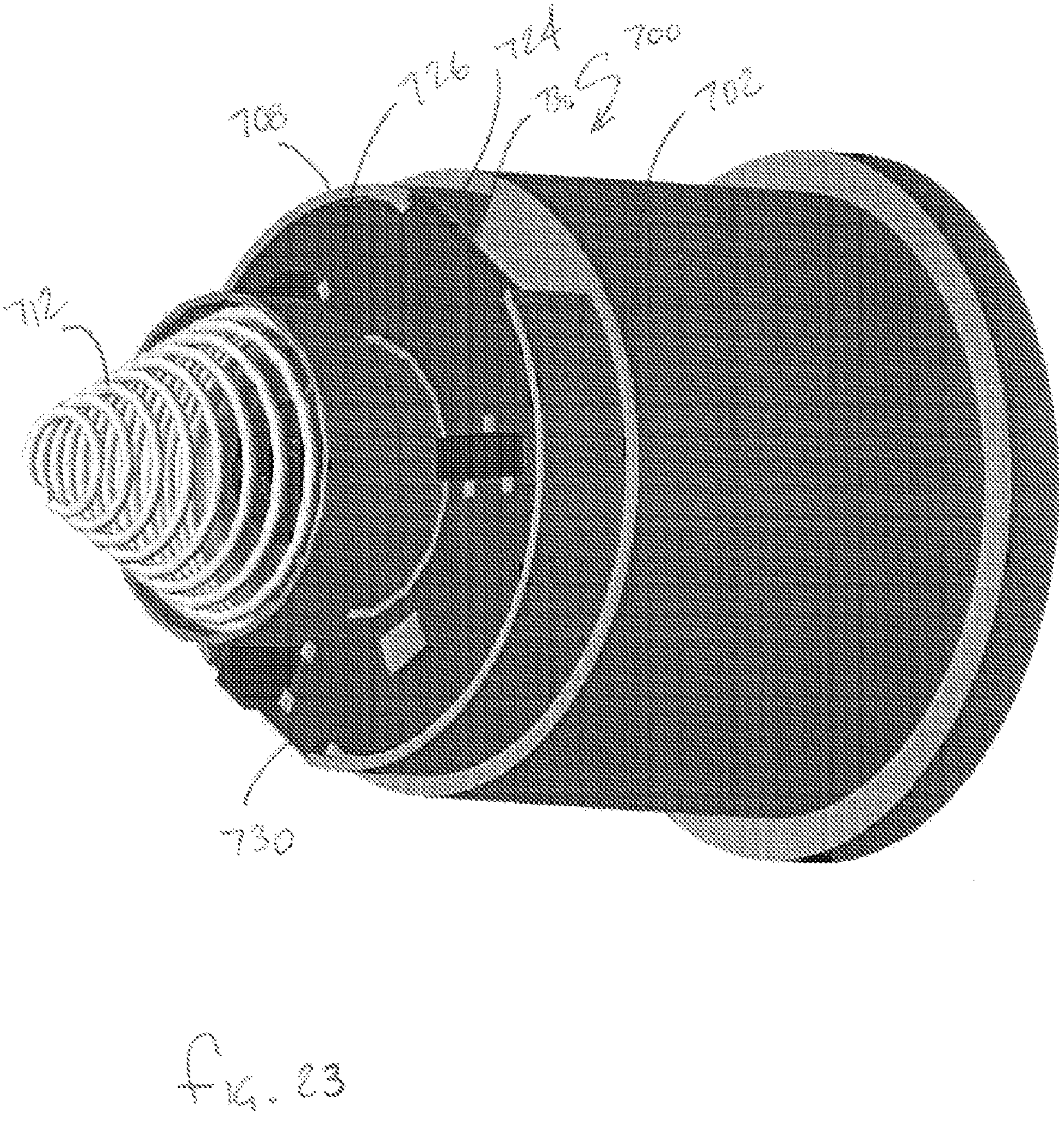
FIG. 23 is a bottom perspective view thereof with the end cap removed.

A sixth alternate embodiment of the LED assembly 700 is shown at FIGS. 21-23. In this embodiment, the LED assembly 700 is provided as a self-contained module that is suitable for incorporation onto any number of different flashlight constructions. The mounting die 702 in this embodiment is formed as a monolithic, electrically conductive and highly thermally conductive assembly. In this manner, as will be further described in detail below, the mounting die 702 serves as a heat sink for dissipating waste heat generated by the LED. As can be seen in FIG. 21, the mounting die may optionally include surface area enhancements 704 on its exterior surface to further assist in the quick dissipation of the waste heat to the atmosphere surrounding the LED assembly 700. The LED assembly 700 can be seen to include a mounting die 702 having a first end 706 and a second end 708, an end cap 710 received at the second end 708 and a contact spring 712 extending from the end cap 710. As can best be seen in the cross sectional view provided in FIG. 22, the mounting die 702 is generally cylindrical and includes an interior cavity 714 at the first end thereof. The interior cavity 714 is shaped to serve as a reflector and may have a highly polished or plated interior surface to enhance its ability to reflect the light output from the LED 12. The reflector 714 may be shaped using any geometry as is well known in the art, including but not limited to spherical, ellipsoidal, parabolic and linear. A lens 716 may be installed adjacent the first end 706 to enclose the reflector cavity 714 thereby sealing it to prevent infiltration of dirt, dust and/or water therein. The second end 708 of the mounting die 702 can be seen to include an opening 720 that extends through the rear wall 722 of the mounting die 702 and into the base of the reflector 714 formed on the interior of the mounting die 702. The rear wall 722 also includes a channel 724 formed therein that is configured to receive the mounting base 20 of the LED 12 in such a manner that the lens portion 18 of the LED 12 extends through the opening 720 and the light output from the LED 12 is directed into the reflector 714. The channel 724 also serves to center and seat the LED 12 such that the LED 12 is centered relative to the optical axis of the reflector 714.

The LED 12 can be seen to be mounted onto a circuit board 726. This may be accomplished by soldering the leads 22 of the LED 12 to contact pads formed directly on the surface of the circuit board 726 or to risers that are provided on the circuit board 726. Additionally, sockets may be provided into which the leads 22 of the LED 12 are inserted thereby placing them into electrical communication with the control circuitry provided on the circuit board 726. Electrical conductivity is provided between the leads 22 of the LED 12 and the exterior of the LED assembly 700 via the circuit board 726. One of the leads 22 of the LED 12 is in contact with a circuit trace that extends through the circuit board 726 to the mounting die 702 and ultimately to the outer surface of the LED assembly 700. The second lead 22 of the LED 12 is in communication with a circuit trace that extends through the circuit board 726 to the spring 712 seen received at the rear thereof. An insulator 728 can be seen separating the spring contact 712 from the remainder of the outer surface of the LED assembly 700 module to prevent a short circuit. Ultimately, the LED assembly 700, once installed into a flashlight structure, receives power through contact with both the spring contact 712 and the outer surface of the LED assembly 700.

Since the LED 12 is seated into the channel 724 in the rear wall 722 of the mounting die 702, and is therefore nearly completely surrounded by the mounting die 702, the heat that is generated by the LED 12 is conducted into the body of the mounting die 702. This heat is transferred by the thermally conductive body of the mounting die 702 to the exterior surface of the LED assembly 700 and is dissipated to the atmosphere.

Another important feature to note in the LED assembly 700 of the present invention can best be seen in FIG. 23. Since the bare leads 22 of the LED 12 are exposed and positioned immediately adjacent the thermally and electrically conductive mounting die 702, rotation of the LED 12 relative to the mounting die 702 could bring both of the LED 12 leads 22 into contact with the walls of the channel 724 in the rear wall 722 of the mounting die 702. Such contact would result in a short circuit and malfunction of the LED assembly 700. To prevent such rotation, the circuit board 708 can be seen to include means for preventing rotation relative to the mounting die 702. In FIG. 23 such means can be seen to include ears 730 formed on opposing sides of the circuit board 726 that engage the walls of the channel 724 when the circuit board 726 is received in assembled relation. These ears 730 prevent rotation of the circuit board 726 relative to the mounting die 702. Similarly, other means for preventing rotation may be utilized and still fall within the scope and spirit of the present disclosure. Those means may include alignment pins, clips, screws or any other such means for preventing rotation as is known in the art.

It can therefore be seen that the present invention 10 provides a compact package assembly for incorporating a high intensity LED 12 into a lighting device. The present invention provides integral heat sink capacity and electrical connections that overcome the drawbacks associated with prior art attempts to use LED's of this type while further creating a versatile assembly 10 that can be incorporated into a wide range of lighting devices. For these reasons, the instant invention is believed to represent a significant advancement in the art, which has substantial commercial merit.

While there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed:

1. A light emitting diode assembly comprising:

a light emitting diode having a mounting base, an output end received on a top surface of said mounting base and a first and second contact lead extending from the sides of said mounting base;

a mounting die, said mounting die having a first end, a second end, an interior cavity extending inwardly from said first end, a rear wall at said second end thereof, a channel extending longitudinally through said rear wall and an opening that extends through said rear wall into said interior cavity; and a circuit board having first and second electrical traces thereon, a top surface and a bottom surface, said light emitting diode is affixed to said top surface of said circuit board, said top surface with said light emitting diode thereon both being received adjacent said rear wall of said mounting die, said channel having side walls configured to receive and align said mounting base of said light emitting diode within said mounting die, wherein said first contact lead in electrical communication with said first electrical trace and said second contact lead in electrical communication with said second electrical trace and said output end is received in said opening such that light emitted from said output end of said light emitting diode is directed into said cavity in said mounting die.

2. The light emitting diode assembly of claim 1, further comprising:

at least one ear extending from a peripheral edge of said circuit board, wherein said ear is received between said channel side walls thereby preventing rotation of said circuit board relative to said mounting die.

3. The light emitting diode assembly of claim 1, further comprising:

means for preventing said circuit board from rotating relative to said mounting die.

4. The light emitting diode assembly of claim 3, said means for preventing said circuit board from rotating comprising:

a channel in a bottom surface of said rear wall of said mounting die; and at least one ear on a peripheral edge of said circuit board, said ear configured to engage side walls of said channel thereby preventing rotation of said circuit board relative to said mounting die.

5. The light emitting diode assembly of claim 1, wherein said mounting die is thermally and electrically conductive and said first electrical trace on said circuit board is in electrical communication with said mounting die.

6. The light emitting diode assembly of claim 5, further comprising:

a spring biased electrical contact extending from and in electrical communication with said bottom surface of said circuit board.

7. The light emitting diode assembly of claim 6, further comprising:

a power source in electrical communication with said spring biased electrical contact extending from said circuit board and said mounting die.

8. The light emitting diode assembly of claim 1, wherein said cavity within said mounting die serves as a reflector cup to direct light output from said light emitting diode.

9. The light emitting diode assembly of claim 8, wherein said reflector cup is shaped to form a parabolic reflector.

10. The light emitting diode assembly of claim 8, wherein said reflector cup is shaped to form an ellipsoidal reflector.

* * * * *